US010215785B2

(12) United States Patent
Haneda

(10) Patent No.: US 10,215,785 B2
(45) Date of Patent: Feb. 26, 2019

(54) SIGNAL PROCESSING DEVICE, DETECTION DEVICE, SENSOR, ELECTRONIC APPARATUS AND MOVING OBJECT

(71) Applicant: Seiko Epson Corporation, Tokyo (JP)

(72) Inventor: Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 744 days.

(21) Appl. No.: 14/567,404

(22) Filed: Dec. 11, 2014

(65) Prior Publication Data
US 2015/0168467 A1 Jun. 18, 2015

(30) Foreign Application Priority Data

Dec. 12, 2013 (JP) ................. 2013-256722
Dec. 12, 2013 (JP) ................. 2013-256724
Dec. 12, 2013 (JP) ................. 2013-256725

(51) Int. Cl.
G01R 23/165 (2006.01)
G01R 29/26 (2006.01)
G01C 21/16 (2006.01)

(52) U.S. Cl.
CPC .......... *G01R 23/165* (2013.01); *G01C 21/16* (2013.01); *G01C 21/165* (2013.01); *G01R 29/26* (2013.01)

(58) Field of Classification Search
CPC .... G01R 23/165; G01R 29/26; G01C 21/165; G01C 21/16
USPC .............. 702/191, 96; 324/617; 382/261; 342/109, 70; 600/324
See application file for complete search history.

(56) References Cited

U.S. PATENT DOCUMENTS

| 6,236,939 B1 * | 5/2001 | Wu ................. B64G 1/361 244/164 |
| 2007/0213933 A1 | 9/2007 | Zeng et al. |
| 2008/0285881 A1 * | 11/2008 | Gal ................. G06T 5/20 382/261 |
| 2009/0287070 A1 * | 11/2009 | Baker, Jr. .......... A61B 5/14551 600/324 |

(Continued)

FOREIGN PATENT DOCUMENTS

| EP | 1837627 A2 | 9/2007 |
| EP | 2533518 A1 | 12/2012 |

(Continued)

OTHER PUBLICATIONS

Singh et al., "Study of Decaying DC Removal Techniques: A Thesis Submitted in Partial Fulfillment of the Requirements for the Degree of Bachelor of Technology in Electrical Engineering", dated May 8, 2010, Department of Electrical Engineering, National Institute of Technology, Rourkela, India (35 pages) (Retrieved from http://ethesis.nitrkl.ac.in/1665/1/National_Institute_of_Technology.pdf on May 19, 2015).

(Continued)

*Primary Examiner* — Bo Fan
(74) *Attorney, Agent, or Firm* — Harness, Dickey & Pierce, P.L.C.

(57) ABSTRACT

A signal processing device includes a Kalman filter that extracts a DC component of an input signal by performing Kalman filter processing on the basis of observation noise and system noise which are estimated from the input signal.

20 Claims, 12 Drawing Sheets

(56) References Cited

U.S. PATENT DOCUMENTS

| | | | |
|---|---|---|---|
| 2009/0326851 A1* | 12/2009 | Tanenhaus | G01C 21/16 702/96 |
| 2010/0036613 A1 | 2/2010 | Zeng et al. | |
| 2011/0156945 A1* | 6/2011 | Miyake | G01S 7/288 342/70 |
| 2012/0105270 A1* | 5/2012 | Miyake | G01S 7/2926 342/109 |
| 2012/0134246 A1* | 5/2012 | Shimazawa | G11B 5/02 369/13.26 |
| 2012/0268141 A1* | 10/2012 | Gierlich | G01S 11/02 324/617 |
| 2012/0330595 A1* | 12/2012 | Atay | G01P 3/46 702/96 |
| 2013/0284859 A1* | 10/2013 | Polivka | B61L 27/0055 246/34 R |

FOREIGN PATENT DOCUMENTS

| | | |
|---|---|---|
| JP | 2000-346661 A | 12/2000 |
| JP | 2002-236302 A | 8/2002 |
| JP | 2004-347505 A | 12/2004 |
| JP | 2007-240532 A | 9/2007 |
| JP | 2009-276242 A | 11/2009 |
| JP | 2013-122384 A | 6/2013 |

OTHER PUBLICATIONS

Extended Search Report for European Patent Application No. 14197614.2 dated Jun. 2, 2015 (7 pages).

* cited by examiner

SIGNAL PROCESSING DEVICE, DETECTION DEVICE, SENSOR, ELECTRONIC APPARATUS AND MOVING OBJECT

BACKGROUND

1. Technical Field

The present invention relates to a signal processing device, a detection device, a sensor, an electronic apparatus, a moving object, and the like.

2. Related Art

Gyro sensors for detecting a physical quantity changing due to external factors are built into electronic apparatuses such as digital cameras and smartphones, and moving objects such as vehicles and airplanes. Such gyro sensors detect a physical quantity such as angular velocity, and are used in so-called shaking correction, posture control, GPS autonomous navigation, and the like.

A gyro sensor outputs the detected physical quantity such as an angular velocity as a detection voltage signal. The application side receiving the detection voltage signal integrates the angular velocity and the like, obtained by the detection voltage signal, using software processing, and obtains an angle, a velocity, a distance, and the like.

A DC offset caused by, for example, the temperature characteristics or the like of a physical quantity transducer is present in a detection voltage signal from the physical quantity transducer. There is a problem in that the DC offset causes an error when desired information is obtained from the detection voltage signal. For example, in the aforementioned gyro sensor, since the detection voltage signal including the DC offset is integrated during the obtaining of an angle and the like, a great increase in error is brought about.

As a method of removing a DC offset, JP-A-2004-347505 discloses a method of processing a detection voltage signal using a high-pass filter. In addition, JP-A-2002-236302 discloses a method of adding a bias having a predetermined voltage to the detection voltage signal. However, since the characteristics of the high-pass filter are fixed in the method of JP-A-2004-347505, there is a problem of the characteristics influencing the transient responsiveness of the detection voltage signal. In the method of JP-A-2002-236302, there is a problem in that it is difficult to follow a change in the DC offset.

SUMMARY

An advantage of some aspects of the invention is to provide a signal processing device, a detection device, a sensor, an electronic apparatus, a moving object, and the like which are capable of extracting a DC component having an improvement in transient responsiveness or followability.

The invention can be implemented as the following aspects or embodiments.

An aspect of the invention relates to a signal processing device including a Kalman filter that extracts a DC component of an input signal by performing Kalman filter processing on the basis of observation noise and system noise which are estimated from the input signal. In addition, in the aspect of the invention, the signal processing device may further include a noise estimation portion that estimates the observation noise and the system noise from the input signal.

According to the aspect of the invention, the observation noise and the system noise are supplied from the outside (noise estimation portion) to the Kalman filter, and the Kalman filter receives the observation noise and the system noise to perform the Kalman filter processing. In this manner, the observation noise and the system noise are supplied from the outside of the Kalman filter, and thus it is possible to control the characteristics of the Kalman filter, and to extract the DC component having an improvement in transient responsiveness or followability.

In the aspect of the invention, the noise estimation portion may estimate the observation noise on the basis of the input signal, and may estimate the system noise by performing gain processing on the estimated observation noise.

With such a configuration, it is possible to dynamically change the observation noise in response to the input signal, and to adjust the system noise using the gain processing for the observation noise. Thereby, it is possible to control the Kalman filter so as to have desired characteristics.

In the aspect of the invention, the noise estimation portion may mean-square the input signal, and may estimate the observation noise by performing limiter processing on the mean-squared signal.

In actual observation, the observation noise is not set to zero. In this regard, according to the aspect of the invention, even when the observation noise estimated from the input signal is set to zero, the lower limit of the observation noise can be restricted by the limiter processing, and thus the observation noise which is not set to zero can be output to the Kalman filter.

In the aspect of the invention, the noise estimation portion may perform the gain processing on the observation noise, using a gain which is set on the basis of a target cut-off frequency of a low-pass filter operation in a convergence state of the Kalman filter.

When the Kalman filter starts to operate and then a sufficient time elapses, the Kalman filter converges on filter characteristics including low-pass filter characteristics. In this convergence state, the cut-off frequency of the low-pass filter characteristics is determined by the gain of the gain processing. That is, the gain is set on the basis of the target cut-off frequency, and thus it is possible to obtain the low-pass filter characteristics of a desired cut-off frequency in the convergence state.

In the aspect of the invention, the noise estimation portion may perform high-pass filter processing on the input signal, and may perform processing of increasing the observation noise on the basis of the signal after the high-pass filter processing.

When the input signal is not set to DC and fluctuates, the estimation accuracy of the DC component of the Kalman filter deteriorates. In this regard, according to the aspect of the invention, the Kalman gain decreases by increasing the observation noise on the basis of the input signal after the high-pass filter processing, and thus it is possible to reduce the degree of the Kalman filter relying on the observation value. Thereby, it is possible to improve the estimation accuracy of the DC component.

In the aspect of the invention, the noise estimation portion may perform peak hold processing on the signal after the high-pass filter processing, and may increase the observation noise on the basis of the signal after the peak hold processing.

When the input signal fluctuates, the signal after the high-pass filter processing may be set to zero. When the signal is zero, the observation noise does not increase. Therefore, the reliability of the observation value improves, and the estimation accuracy of the DC component deteriorates. In this regard, according to the aspect of the present embodiment, since the signal can be prevented from being set to zero using the peak hold processing, it is possible to increase the observation noise while the input signal fluctuates, and to improve the estimation accuracy of the DC component.

In the aspect of the invention, the signal processing device may further include a monitoring portion that monitors the input signal, the monitoring portion may determine whether a signal level of the input signal exceeds a predetermined range, as the monitoring, and the Kalman filter may stop observation update of an error covariance when it is determined by the monitoring portion that the signal level of the input signal exceeds the predetermined range.

When it is determined by the monitoring portion that the signal level of the input signal exceeds the predetermined range, the observation update of the error covariance in the Kalman filter processing is stopped. In this manner, the Kalman filter processing controlled on the basis of the input signal is performed, and thus it is possible to extract the DC component having an improvement in transient responsiveness or followability.

In the aspect of the invention, the signal processing device may further include a noise estimation portion that estimates the observation noise on the basis of the input signal, and the noise estimation portion may stop updating the estimation of the observation noise when it is determined by the monitoring portion that the signal level of the input signal exceeds the predetermined range.

When the change of the input signal is large, there is the possibility of accurate observation noise not being able to be extracted from the input signal. In this regard, according to the aspect of the invention, when the signal level of the input signal exceeds the predetermined range, it is possible to stop updating the estimation of the observation noise, and thus it is possible to improve the estimation accuracy of the observation noise.

In the aspect of the invention, the monitoring portion may compare an absolute value of the input signal with a threshold corresponding to the predetermined range, and may output a stop signal when the absolute value is larger than the threshold, the Kalman filter may stop observation update of the error covariance when the stop signal is received, and the noise estimation portion may stop updating the estimation of the observation noise when the stop signal is received.

With such a configuration, it is possible to determine whether the signal level of the input signal falls within the predetermined range on the basis of the comparison of the absolute value of the input signal with the threshold, and to perform the observation update of the error covariance or update the estimation of the observation noise when the signal level of the input signal falls within the predetermined range.

In the aspect of the invention, the signal processing device may further include a storage portion that stores a DC designated value corresponding to temperature characteristics of a DC component of the input signal and a deviation range of the DC designated value, and the predetermined range may be the deviation range.

The input signal is monitored using the deviation range as the predetermined range, and thus it is possible to determine whether the signal level of the input signal exceeds a range in which a true value is estimated to be present. By stopping the estimation of the observation noise on the basis of this determination result, and stopping the observation update of the error covariance, the Kalman filter can intensively perform a DC estimation in a range which is expected to be close to the true value of the DC component.

In the aspect of the invention, the signal processing device may further include a subtraction portion that subtracts the DC designated value from the input signal, the Kalman filter may perform the Kalman filter processing on the input signal after the subtraction, and the monitoring portion may monitor the input signal after the subtraction.

When the estimation value is considerably far from the true value, the Kalman filter requires time to perform convergence again. In this regard, according to the aspect of the invention, the DC designated value is subtracted from the input signal to thereby input the resultant to the Kalman filter, and thus it is possible to give the DC designated value as an approximate predictive value of the true value. Thereby, it is possible to cause the Kalman filter to intensively search for the periphery of the DC designated value, and to prevent the estimation value from being far apart from the true value.

In the aspect of the invention, the signal processing device may further include a noise estimation portion that estimates the observation noise on the basis of the input signal, and the noise estimation portion may increase the observation noise when the signal level of the input signal exceeds a second predetermined range.

The observation noise is increased, and thus it is possible to reduce the degree of the Kalman filter relying on the observation value. The observation value is an input signal, and thus the reliability of the input signal deteriorates when the signal level of the input signal exceeds the second predetermined range. Thereby, it is possible to estimate the DC component by relying on the observation value relatively within the second predetermined range in which the true value is expected to be present, and to improve estimation accuracy.

In the aspect of the invention, the noise estimation portion may include a limiter that limits the signal level of the input signal to a predetermined lower limit when the signal level of the input signal falls within the second predetermined range, and a multiplication portion that multiplies the observation noise by the signal level of the input signal which is limited by the limiter.

With such a configuration, since the observation noise is multiplied by the lower limit within the second predetermined range, it is possible to reduce the observation noise more than outside of the second predetermined range. Thereby, it is possible to cause the Kalman filter to rely on the observation value relatively within the second predetermined range.

In the aspect of the invention, the noise estimation portion may output the system noise based on an output signal of the temperature sensor to the Kalman filter.

The observation noise and the system noise which is based on the output signal of the temperature sensor are output, and the Kalman filter processing is performed on the basis of the observation noise and the system noise. In this manner, the observation noise and the system noise are supplied from the outside of the Kalman filter, and thus it is possible to control the characteristics of the Kalman filter, and to extract the DC component having an improvement in transient responsiveness or followability.

In the aspect of the invention, the noise estimation portion may increase the system noise in response to a change in the output signal of the temperature sensor.

By using a change in the output signal of the temperature sensor, information regarding at what rate the DC component changes in response thereto is obtained. It is possible to increase the system noise so that the Kalman filter allows the passage of the frequency, and to cause the filter to follow a change in the DC component depending on a change in temperature.

In the aspect of the invention, the noise estimation portion may increase the system noise by performing gain processing of multiplying a change value of the output signal of the temperature sensor by a predetermined gain.

With such a configuration, it is possible to control the filter characteristics of the Kalman filter by multiplying the predetermined gain. That is, the predetermined gain is appropriately set, and thus it is possible to cause the Kalman filter to follow a change in the DC component depending on a change in temperature.

In the aspect of the invention, the noise estimation portion may perform the gain processing using the predetermined gain which is set on the basis of a temperature variation coefficient of the input signal and sensitivity of the temperature sensor.

The rate at which the DC component changes with respect to a change in the output signal of the temperature sensor is related to the sensitivity of the temperature sensor and the temperature variation coefficient of the input signal. That is, the predetermined gain is set from the information, and thus it is possible to cause the filter characteristics of the Kalman filter to follow a temperature variation in the DC component of the input signal.

In the aspect of the invention, the Kalman filter may follow a change in the DC component depending on a change in temperature by changing a cut-off frequency of a low-pass filter operation in a convergence state on the basis of the system noise.

In the convergence state which is a state of the Kalman filter when a sufficient time elapses, the Kalman filter performs a low-pass filter operation. The system noise is changed, and thus it is possible to change the cut-off frequency thereof, and to change the frequency adaptively to filter characteristics of passing a change in the DC component depending on a change in temperature.

In the aspect of the invention, the signal processing device may further include a subtraction portion that subtracts a DC designated value corresponding to temperature characteristics of a DC component of the input signal from the input signal, and the Kalman filter may perform Kalman filter processing on the input signal after the subtraction.

In the aspect of the invention, the signal processing device may further include a storage portion that stores the DC designated value.

The DC designated value corresponds to the temperature characteristics of the DC component, but includes an error due to an approximation with respect to the true value, and an error due to an individual difference. For this reason, even after the DC designated value is subtracted from the input signal, the temperature characteristics of the DC component remain. According to the aspect of the invention, it is possible to follow a change in the DC component due to the remaining temperature characteristics.

Another aspect of the invention relates to a detection device including a detection circuit that receives a detection signal from a physical quantity transducer, and detects a physical quantity signal based on a physical quantity, and the signal processing device according to the aspect of the invention described above which extracts the DC component, using the physical quantity signal as the input signal.

Still another aspect of the invention relates to a sensor including the detection device according to the aspect of the invention described above, and the physical quantity transducer.

Yet another aspect of the invention relates to an electronic apparatus including the signal processing device according to the aspect of the invention described above.

Still yet another aspect of the invention relates to a moving object including the signal processing device according to the aspect of the invention described above.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail. The embodiments described below do not unduly limit the content of the invention described in the appended claims, and all the configurations described in the embodiments are not necessarily essential for the advantages of the invention.

1. Signal Processing Device

Hereinafter, a signal processing device of the present embodiment will be described by taking an example of extracting a DC offset from a physical quantity signal of a physical quantity transducer. Without being limited to the physical quantity signal of the physical quantity transducer, the present embodiment can be applied as long as a DC component is extracted from an input signal.

Figure 1:
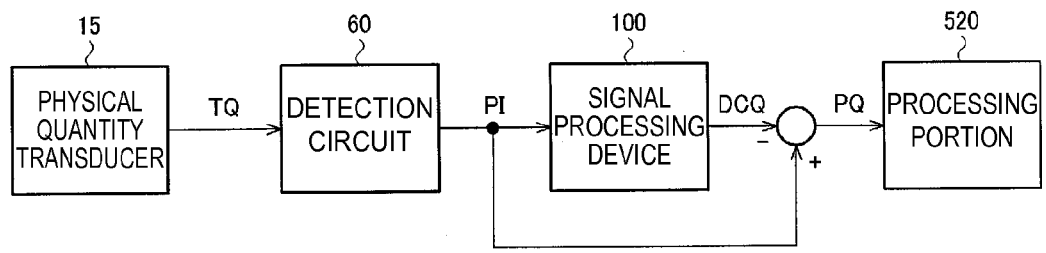
FIG. 1 is a basic configuration example illustrating an electronic apparatus.

FIG. 1 shows a basic configuration example of an electronic apparatus to which a signal processing device 100 of the present embodiment is applied. The electronic apparatus includes a physical quantity transducer 15, a detection circuit 60, a signal processing device 100, and a processing portion 520.

The physical quantity transducer 15 converts a physical quantity such as, for example, an angular velocity, an acceleration, an angular acceleration or a velocity into an electrical signal (voltage or current). As the physical quantity transducer 15, various devices (sensors) such as a vibrator or an acceleration sensor in a gyro sensor can be assumed. The detection circuit 60 performs detection processing (such as synchronous detection) of the physical quantity such as an angular velocity, acceleration, an angular acceleration or a velocity, on the basis of a detection signal TQ (such as a current signal or a voltage signal) from the physical quantity transducer 15, and outputs a physical quantity signal PI (detection data) based on the physical quantity to the signal processing device 100.

The signal processing device 100 extracts a DC component DCQ from the physical quantity signal PI, subtracts the DC component DCQ from the physical quantity signal PI, and outputs a signal after the subtraction as an output signal PQ (output data). In FIG. 1, for the sake of convenience, a subtraction portion is described outside the signal processing device 100. The DC component DCQ is a component having a frequency lower than that of a desired signal component which is desired to be extracted from the physical quantity signal PI. For example, when the physical quantity transducer 15 is a gyro sensor, an offset is contained in the physical quantity signal PI, and a change based on the offset becomes an actual signal component. The frequency of this signal component corresponds to the frequency of motion detected by the gyro sensor. Since the offset temporally fluctuates due to a change in temperature or the like, the frequency is not zero, but is a frequency lower than the frequency of motion.

The processing portion 520 may use the output signal PQ from a detection device 20 as it is, but may perform integration processing of this output signal PQ to use the integration result value. For example, when the physical quantity transducer 15 is a gyro sensor, the detection device 20 outputs angular velocity data to the processing portion 520 on the basis of a signal from a vibrator. The processing portion 520 performs integration processing of the angular velocity data, and obtains angle data. Since a DC component is removed by the signal processing device 100, accurate angle data having a small error can be obtained even when the integration processing is performed.

Incidentally, as a first comparative example of the present embodiment, a method of removing a DC component using the aforementioned high-pass filter is considered. However, when a cutoff is set for a very low frequency in order to remove the DC component, there is a problem in that it takes time until the high-pass filter converges. A cutoff has to be set for a certain amount of frequency in order to enhance a convergence time, and thus there is a problem in that the passband of a signal is restricted. For example, in a gyro sensor, slow motion is not likely to be detected.

As a second comparative example, a method of converging an error due to the DC component using an adaptive filter is considered. For example, an error such as an angle measured by a gyro sensor is converged on the basis of information from a inertial sensor separate from the gyro sensor. However, in this method, filter characteristics change adaptively, but there is a problem in that another inertial sensor is required.

Figure 2:
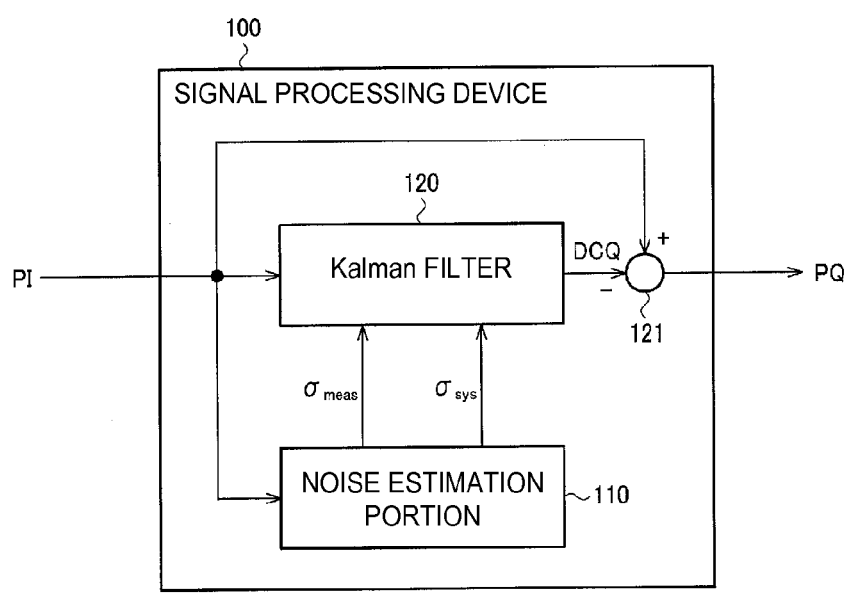
FIG. 2 is a configuration example illustrating a signal processing device.
Figure 3:
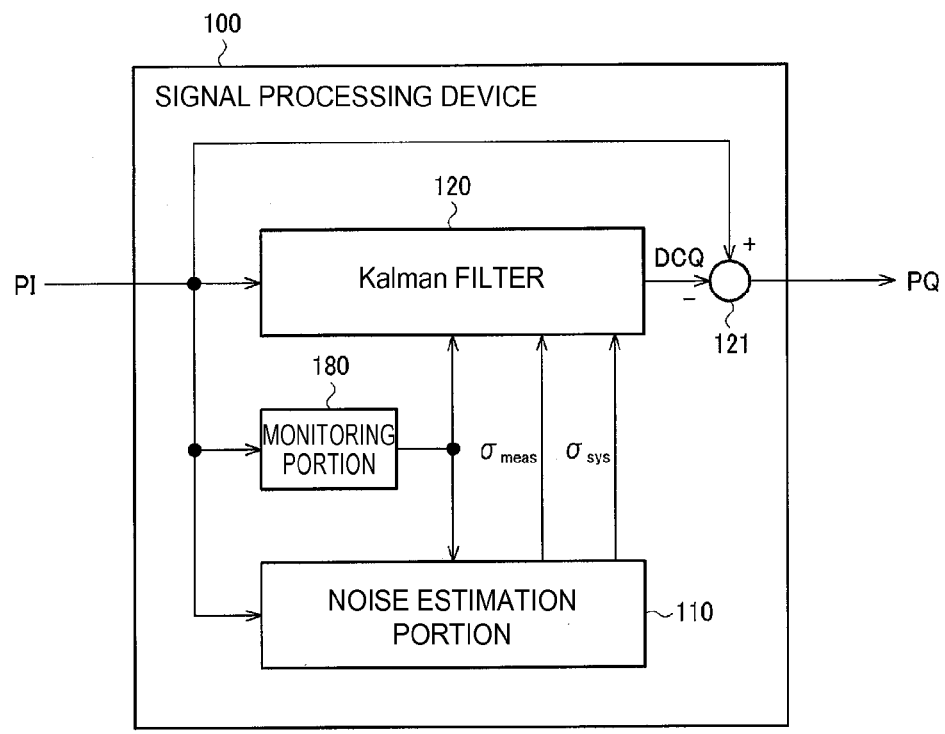
FIG. 3 is a configuration example illustrating the signal processing device.
Figure 4:
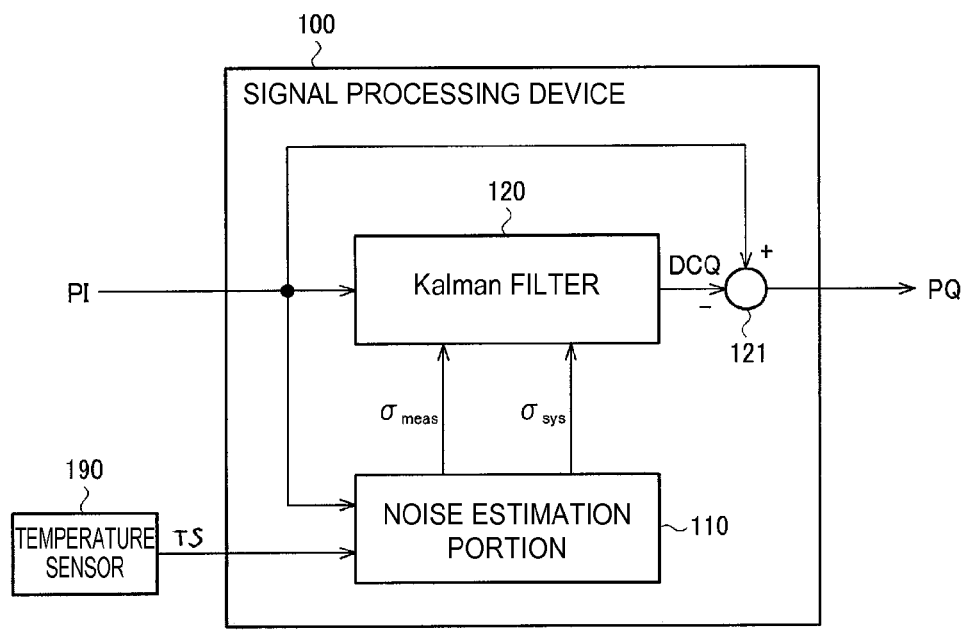
FIG. 4 is a configuration example illustrating the signal processing device.

FIGS. 2, 3, and 4 show configuration examples of the signal processing device 100 according to the present embodiment which is capable of solving the above-mentioned problem. In the following, an outline will be described, and detailed configurations and operations will be described later. In addition, in the following, an example in which the physical quantity transducer 15 is a gyro sensor will be described, but the physical quantity transducer 15 is not limited to a gyro sensor as described above.

The signal processing device 100 shown in FIG. 2 includes a noise estimation portion 110, a Kalman filter 120, and a subtraction portion 121.

The noise estimation portion 110 receives the physical quantity signal PI as an input signal (input data), and estimates observation noise a $\sigma_{meas}$ and system noise $\sigma_{sys}$ which dynamically change in response to the input signal PI. Specifically, the noise estimation portion 110 generates the observation noise a $\sigma_{meas}$ and the system noise $\sigma_{sys}$ from the input signal PI, and changes the observation noise a $\sigma_{meas}$ and the system noise $\sigma_{sys}$ in response to the value of the input signal PI or the change.

The Kalman filter 120 performs Kalman filter processing on the basis of the observation noise a $\sigma_{meas}$ and the system noise as $\sigma_{sys}$, and extracts the DC component DCQ of the input signal PI. The subtraction portion 121 subtracts the DC component DCQ from the input signal PI, and outputs the output signal PQ. The Kalman filter processing is processing in which, on the assumption that noise (error) is contained in an observation value and a variable indicating the state of a system, the desired state of a system is estimated using observation values acquired from the past to the present. In the present embodiment, the observation value is the physical quantity signal PI of the gyro sensor, and the variable to be estimated is the DC component DCQ. Specifically, a state is estimated by repeatedly performing an observation update (observation process) and a time update (prediction process). The observation update is a process of updating a Kalman gain, an estimation value, and an error covariance, using the observation value and the result of the time update. The time update is a process of predicting an estimation value at the next time and an error covariance, using the result of the observation update.

In a general Kalman filter, the initial value of the error covariance and the system noise are given in advance as known values. In the error covariance, values are updated by the observation update or the time update. In this manner, in the general Kalman filter, observation noise or system noise is not newly given from the outside during the course of the repetition of update.

On the other hand, in the present embodiment, the observation noise a $\sigma_{meas}$ and the system noise $\sigma_{sys}$ are dynamically changed, and are supplied from the outside to the Kalman filter 120. As described later in the following Expressions (6) to (10), the observation noise a $\sigma_{meas}$ and the system noise $\sigma_{sys}$ influence an internal variable such as a Kalman gain g(k). This means that the filter characteristics of the Kalman filter 120 can be controlled by controlling the observation noise a $\sigma_{meas}$ and the system noise $\sigma_{sys}$. In the present embodiment, using this point, a passband is set to have a low frequency when the DC component of the physical quantity signal PI of the gyro sensor does not change, and thus the passband of a signal component can be expanded to the low-frequency side. In addition, when the DC component changes, the passband is expanded by changing the observation noise a $\sigma_{meas}$ and the system noise $\sigma_{sys}$, and thus it is possible to follow a change in the DC component. In this manner, transient responsiveness to a change in the physical quantity signal PI or followability for a change in the DC component can be improved without adding a new inertial sensor.

Specifically, as described later in FIG. 5, the noise estimation portion 110 estimates the observation noise a $\sigma_{meas}$ on the basis of the input signal PI, and estimates the system noise $\sigma_{sys}$ by performing gain processing on the estimated observation noise a $\sigma_{meas}$.

With such a configuration, it is possible to dynamically change the observation noise a $\sigma_{meas}$ and the system noise $\sigma_{sys}$ in response to the input signal PI, and to control the characteristics of the Kalman filter 120 in response to the input signal PI. In addition, the system noise $\sigma_{sys}$ can be adjusted by changing the gain of the gain processing, thereby allowing the Kalman filter 120 to be controlled so as to have desired characteristics.

More specifically, the noise estimation portion 110 performs the gain processing on the observation noise a $\sigma_{meas}$, using a gain which is set on the basis of the target cut-off frequency of a low-pass filter operation in the convergence state of the Kalman filter 120.

When the Kalman filter 120 starts to operate and then a sufficient time elapses, the internal variable such as a Kalman gain converges on a constant value as represented in the following Expression (14) or the like, and the Kalman filter 120 converges on filter characteristics including low-pass filter characteristics. In this convergence state, the cut-off frequency $f_c$ of the low-pass filter is determined by a gain GA1 as represented in the following Expressions (17) to (19). Conversely, the gain GA1 is set so that the desired cut-off frequency $f_c$ is obtained, and thus the low-pass filter characteristics of the desired cut-off frequency $f_c$ can be obtained when the Kalman filter 120 is set to be in a convergence state.

In the present embodiment, the Kalman filter 120 is used, thereby allowing a very low cut-off frequency of, for example, approximately 0.1 mHz to be obtained in the convergence state. Thereby, it is possible to extract only a component having a very low frequency, as the DC component DCQ, from the physical quantity signal PI of the gyro sensor, and to output a signal component of motion as the output signal PQ without damaging a band on the low-frequency side by subtracting the DC component DCQ.

As described later in FIG. 5, the noise estimation portion 110 mean-squares the input signal PI, and estimates the observation noise a $\sigma_{meas}$ by performing limiter processing on the mean-squared signal.

Figure 5:
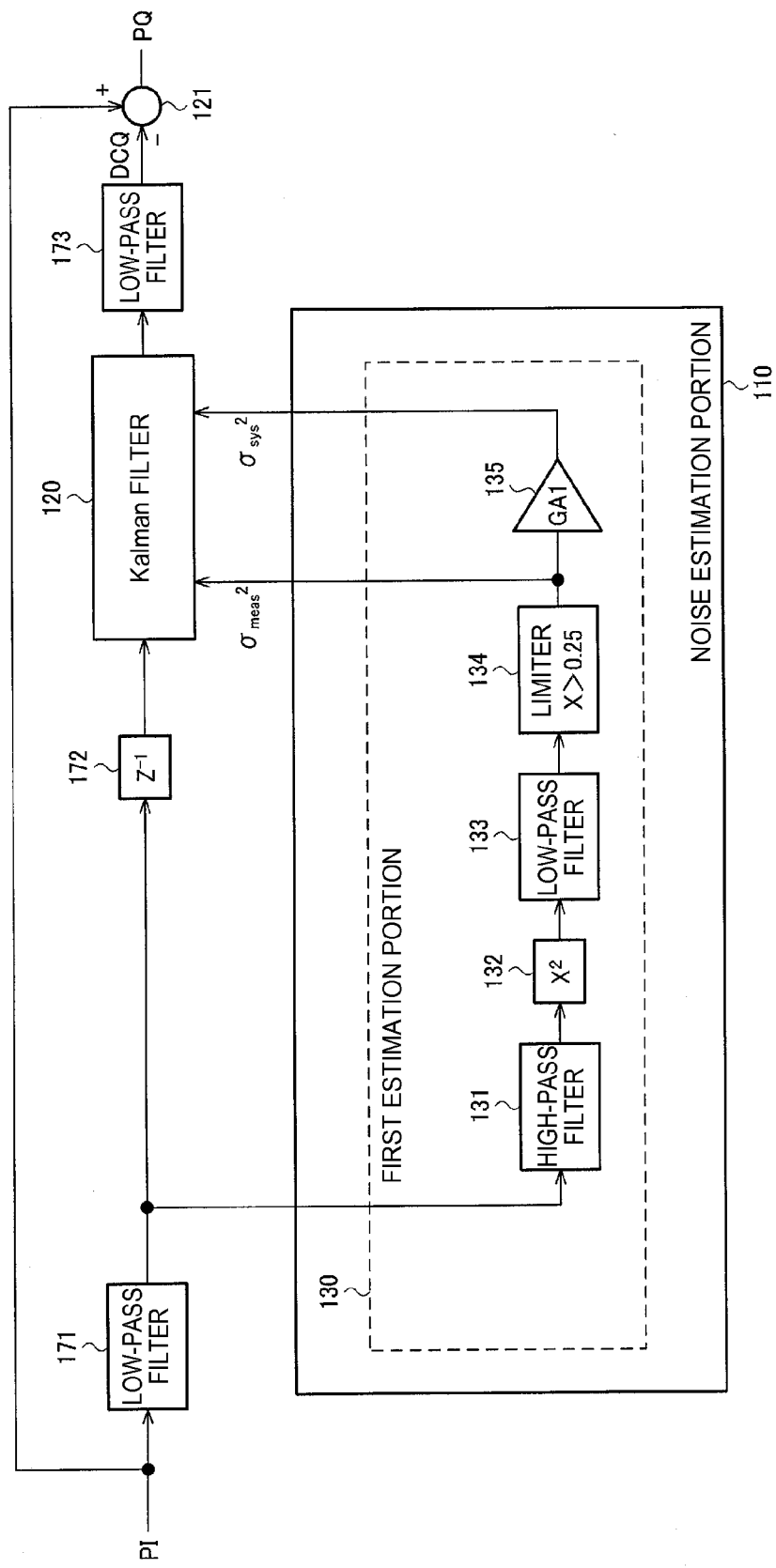
FIG. 5 is a first detailed configuration example illustrating the signal processing device.

For example, in FIG. 5, since smoothing is performed by a low-pass filter 133 having a very low frequency during mean square, and the signal component of motion is removed from the physical quantity signal PI, the mean square of a noise component can be left behind. In this manner, it is possible to extract the observation noise a $\sigma_{meas}$ from the input signal PI by mean-squaring the input signal PI.

When the observation noise $\sigma_{meas}$ is set to zero, the relation of Kalman gain $g(k)=1$ is established as can be seen from the following Expression (8), and the relation of estimation value $x(k)$=observation value $y(k)$ is established as can be seen from the following Expression (9). Therefore, the Kalman filter 120 outputs the observation value $y(k)$ as it is. However, in reality, the observation noise $\sigma_{meas}$ is not zero in any case. In this regard, in the present embodiment, the observation noise $\sigma_{meas}$ can be restricted to a value larger than zero by the limiter processing. For example, quantization noise when A/D conversion is performed on an output signal TQ of the gyro sensor is considered as minimum observation noise, and thus a value obtained by estimating the quantization noise may be set to a limit value.

In addition, as described later in FIG. 6, the noise estimation portion 110 performs high-pass filter processing on the input signal PI, and performs processing of increasing the observation noise $\sigma_{meas}$ on the basis of a signal after the high-pass filter processing. That is, the second estimation portion 140 increases the observation noise a $\sigma_{meas}$ by adding a signal generated from the input signal PI after the high-pass filter processing to the observation noise a $\sigma_{meas}$.

When the gyro sensor detects a motion, the value of the input signal PI fluctuates and is not set to DC, and thus the reliability of the observation value deteriorates for the purpose of extracting the DC component. In this case, the observation noise $\sigma_{meas}$ is increased on the basis of the input signal PI after the high-pass filter processing, and thus the Kalman gain $g(k)$ can be reduced as can be seen from the following Expression (8). When the Kalman gain $g(k)$ becomes smaller, as can be seen from the following Expression (9), the Kalman filter 120 relies on a past estimation value $x^-(k)$. That is, when the physical quantity signal PI of the gyro sensor is not DC, the reliability of the physical quantity signal PI which is an observation value is reduced, and thus a past estimation value which is considered to be close to a true value can be output as the DC component DCQ.

Specifically, the noise estimation portion 110 performs peak hold processing on the signal after the high-pass filter processing, and increases the observation noise $\sigma_{meas}$ on the basis of the signal after the peak hold processing.

As described above, when the gyro sensor detects a motion, the Kalman filter 120 is caused to rely on the past estimation value, thereby allowing the estimation accuracy of the DC component to be improved. In this case, it is possible to estimate the DC component with a higher level of accuracy by performing the peak hold processing.

Figure 6:
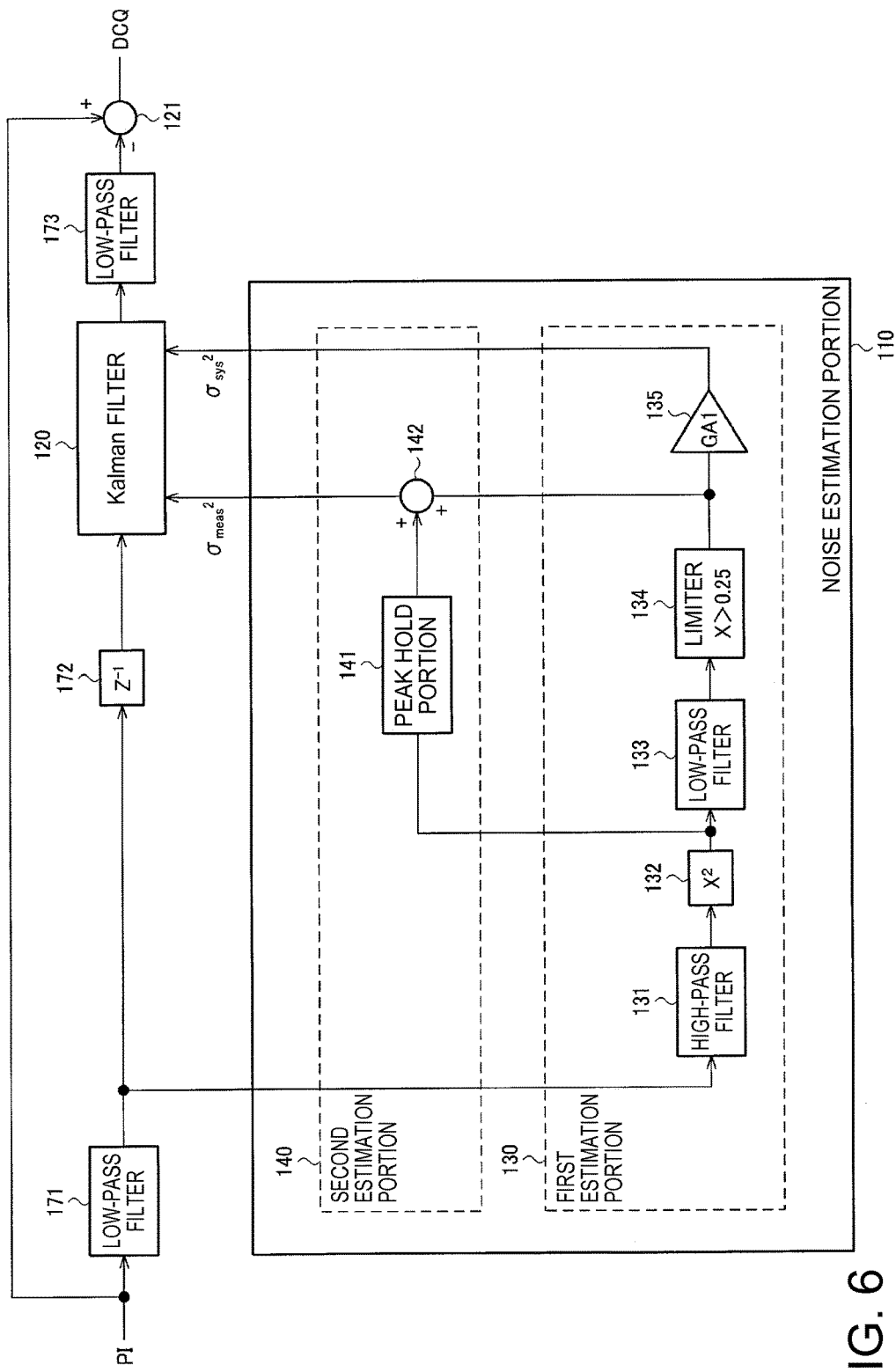
FIG. 6 is a second detailed configuration example illustrating a signal processing device.
Figure 7:
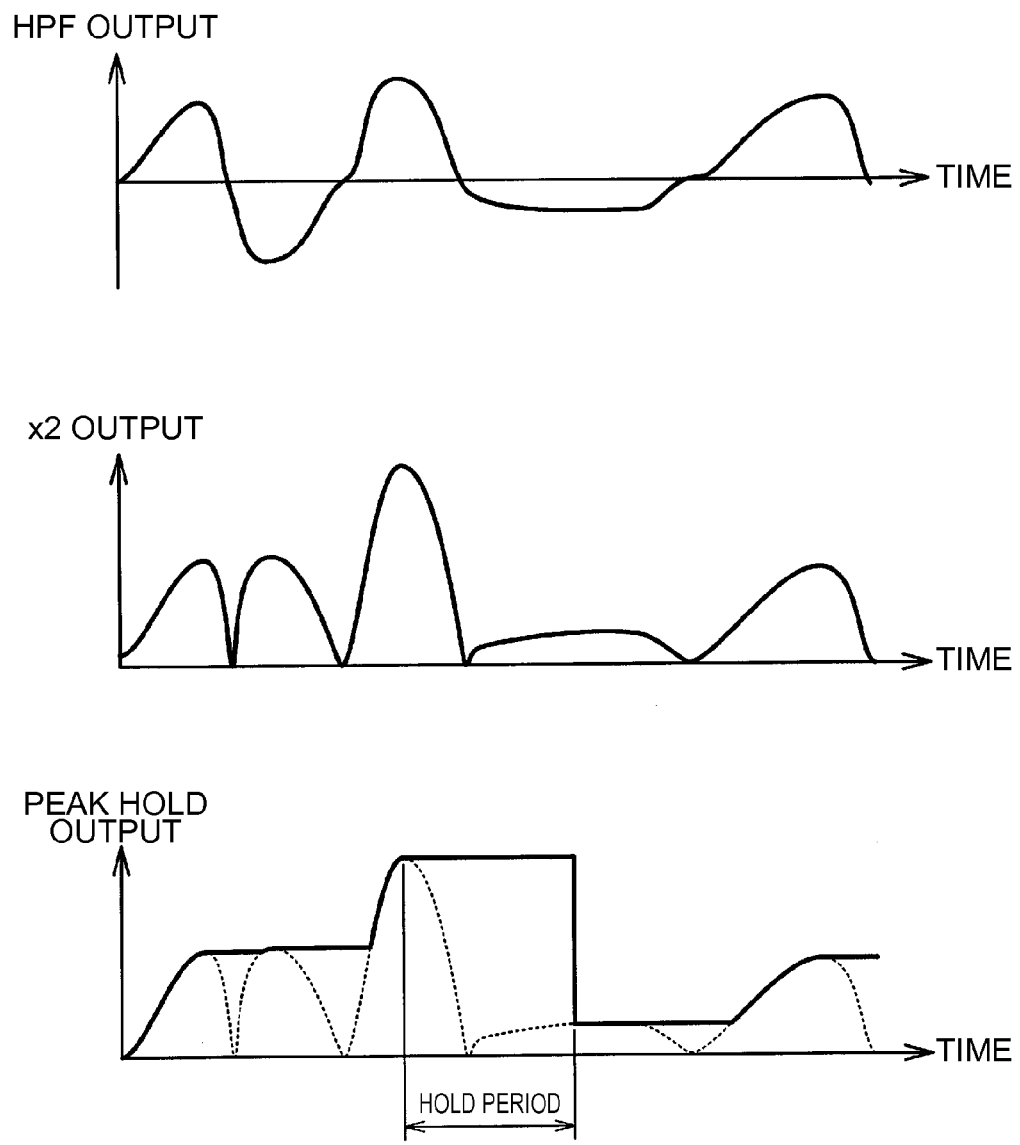
FIG. 7 is a diagram illustrating peak hold processing.

For example, in FIG. 6, the signal after the high-pass filter processing is mean-squared, and the peak hold processing is performed on the mean-squared signal. As shown in FIG. 7, when the signal after the high-pass filter processing is zero, the mean-squared signal is also set to zero. An increase in the observation noise $\sigma_{meas}$ on the basis of such a signal leads to no increase in the observation noise a $\sigma_{meas}$ when the signal is zero, and thus the Kalman gain $g(k)$ becomes larger as can be seen from the following Expression (8). Then, as can be seen from the following Expression (9), the Kalman filter 120 relies on the observation value $y(k)$ having low reliability, which results in the possibility of an inaccurate DC component being output.

In this regard, in the present embodiment, the peak hold processing is performed, and thus the mean-squared signal can be prevented from being set to zero. The observation noise $\sigma_{meas}$ is increased using the signal, and thus the estimation accuracy of the DC component can be improved by causing the Kalman filter 120 to rely on the past estimation value when the gyro sensor detects a motion.

The signal processing device 100 shown in FIG. 3 includes the noise estimation portion 110, the Kalman filter 120, the subtraction portion 121, and a monitoring portion 180. The same components as those in signal processing device 100 shown in FIG. 2 are denoted by the same reference numerals and signs, and thus the description thereof will not be given.

Figure 9:
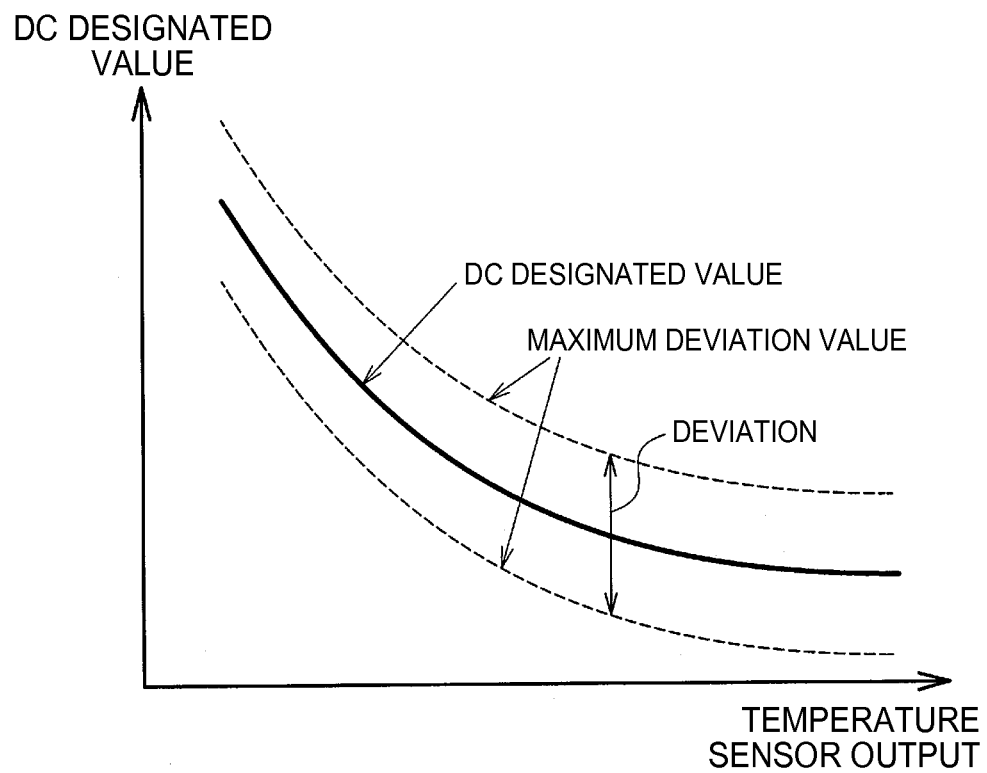
FIG. 9 is a diagram illustrating a DC designated value, deviation, and maximum deviation values.

The monitoring portion 180 receives a physical quantity signal PI as an input signal (input data), and monitors the input signal PI. Specifically, the monitoring portion 180 determines whether the signal level of the input signal PI exceeds a predetermined range. As described later in FIG. 9, the predetermined range is a range (deviation range of a DC designated value) in which the true value of the DC component is expected to be present. In the example of FIG. 9, the temperature characteristics of the DC component are experimentally measured in advance, and a predetermined range is set in consideration of its variation, degradation over time or the like. The predetermined range may be constant irrespective of a temperature, and may change depending on the temperature.

When it is determined by the monitoring portion 180 that the signal level of the input signal PI exceeds the predetermined range, the Kalman filter 120 stops observation update of an error covariance P(k). The observation update of the error covariance P(k) is performed by the following Expression (10). For example, the arithmetic operation of the following Expression (10) is not performed to thereby stop the observation update. Alternatively, the arithmetic operation of the following Expression (10) is performed, but the result is not written in a register that stores the error covariance P(k), to thereby stop the observation update. After the observation update is stopped, time update of the following Expressions (6) and (7) is performed using the error covariance P(k) at a point in time when stopping is performed.

The Kalman filter 120 performs an estimation even when the input signal PI changes greatly. Since the observation value y(k) and the estimation value x(k) are not contained in the following Expressions (7), (8), and (10), the filter reaches a convergence state regardless of the input signal PI.

In this regard, according to the present embodiment, when the signal level of the input signal PI exceeds the predetermined range, the Kalman filter 120 stops the estimation operation of the DC component by stopping updating the error covariance P(k), and holds a state immediately before stopping. Thereby, it is possible to raise the reliability of the estimation value x⁻(k), and to improve the estimation accuracy of the DC component.

This causes the operation of the Kalman filter 120 to be adaptively controlled in response to the input signal PI. Thereby, filter characteristics can be controlled without using another inertial sensor as described in the second comparative example. In addition, the Kalman filter performs filtering while changing filter characteristics originally adaptively, and thus it is possible to improve a transient response or followability as compared to a case where such fixed filter characteristics as described in the first comparative example are used.

The noise estimation portion 110 estimates the observation noise $\sigma_{meas}$ on the basis of the input signal PI. In this case, when it is determined by the monitoring portion 180 that the signal level of the input signal PI exceeds the predetermined range, the estimation update of the observation noise $\sigma_{meas}$ is stopped. Specifically, as described later in FIG. 5, a square processing portion 132 and the low-pass filter 133 mean-square the input signal PI, and the mean-squared signal is estimated as the dispersion of the observation noise a $\sigma_{meas}$. As described later in FIG. 8, when the signal level of the input signal PI exceeds the predetermined range, the operation of the low-pass filter 133 is stopped, and the estimation of the observation noise $\sigma_{meas}$ is stopped. After the estimation is stopped, the observation noise a $\sigma_{meas}$ at the time of stopping is output.

When the gyro sensor detects a motion and the input signal PI fluctuates greatly, there is the possibility of the signal being inaccurate even when the noise component (that is, observation noise $\sigma_{meas}$) thereof is extracted. In this regard, according to the present embodiment, only when the signal level of the input signal PI falls within the predetermined range, the observation noise $\sigma_{meas}$ can be generated from the input signal PI. That is, the high-accuracy observation noise $\sigma_{meas}$ can be estimated from the input signal PI having a relatively small change.

As described later in FIG. 8, the monitoring portion 180 compares the absolute value of the input signal PI with a threshold corresponding to the predetermined range, and outputs a stop signal (flag FL1) when the absolute value of the input signal PI is larger than the threshold. When the stop signal is received, the Kalman filter 120 stops the observation update of the error covariance P(k). When the stop signal is received, the noise estimation portion 110 stops updating the estimation of the observation noise a $\sigma_{meas}$.

With such a configuration, it is possible to determine whether the input signal PI falls within the predetermined range on the basis of the comparison of the absolute value of the input signal PI with the threshold. Since the predetermined range can be changed by changing the threshold, it is possible to set the predetermined range appropriate to the characteristics of the input signal PI, and to improve the estimation accuracy of the observation noise $\sigma_{meas}$.

Figure 8:
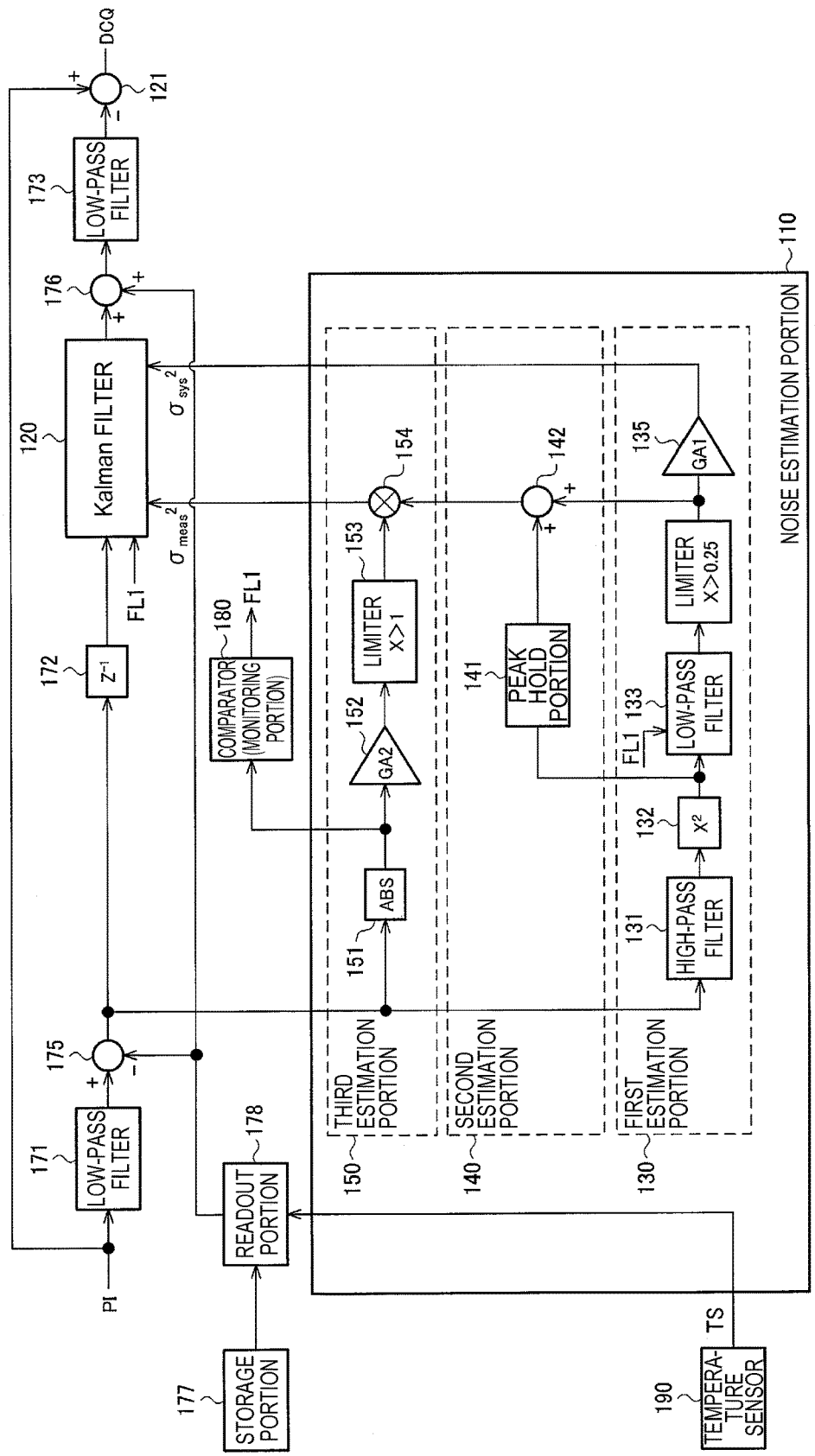
FIG. 8 is a third detailed configuration example illustrating the signal processing device.

Specifically, as shown in FIG. 8, the signal processing device 100 includes a storage portion 177 that stores a DC designated value (solid line of FIG. 9) corresponding to the temperature characteristics of the DC component of the input signal PI and a deviation range (range shown by dotted lines of FIG. 9) of the DC designated value. The monitoring portion 180 determines whether the signal level of the input signal PI exceeds the predetermined range, using the predetermined range as the deviation range. For example, the temperature characteristics of a DC offset are measured in advance with respect to the physical quantity signal PI of the physical quantity transducer 15, the variation of the DC offset is set to the deviation range, and the central value of the variation is set to the DC designated value.

With such a configuration, it is possible to set the predetermined range on the basis of the temperature characteristics of the DC component contained in the physical quantity signal PI of the gyro sensor. The DC designated value is a value obtained by previously expecting the true value of the DC component, and the deviation range is a range obtained by expecting how much the true value thereof fluctuates (for example, individual difference). When the input signal PI deviates from a range in which a true value is assumedly present by monitoring the input signal PI using such a deviation range as the predetermined range, the estimation of the observation noise $\sigma_{meas}$ is stopped, and thus the observation update of the error covariance P(k) can be stopped. Thereby, the Kalman filter 120 can intensively perform a DC estimation in a range where the input signal PI is expected to be close to the true value of the DC component.

As described later in FIG. 8, the signal processing device 100 includes a subtraction portion 175 that subtracts the DC designated value from the input signal PI. The Kalman filter 120 performs Kalman filter processing on the input signal PI after the subtraction. The monitoring portion 180 monitors the input signal PI after the subtraction.

The Kalman filter 120 operates so as to make the estimation value of the DC component converge on the true value. However, once the estimation value is considerably far from the true value, it takes time to perform convergence again. The Kalman filter 120 extracts the DC component, and thus operates like a low-pass filter of which the cut-off frequency is very low (for example, 0.1 mHz). That is, a long time of the reciprocal degree of the cut-off frequency is taken for the estimation value to follow the true value.

In this regard, according to the present embodiment, the DC designated value is a value obtained by expecting the true value of the DC offset as described above. This DC designated value is subtracted from the input signal PI, and thus can be input to the Kalman filter 120 in a state where the DC offset contained in the input signal PI is reduced (set to nearly zero). Thereby, since the true value is present in the vicinity of zero, it is possible to cause the Kalman filter 120 to intensively search for the range thereof, and to prevent the estimation value from being far apart from the true value.

As described later in FIG. 8, when the signal level of the input signal PI exceeds a second predetermined range (d of the following Expression (20)), the noise estimation portion 110 increases the observation noise $\sigma_{meas}$. The second predetermined range is a range for discriminating whether a change in the input signal PI is large, and is a range for instructing the Kalman filter 120 to set the search range of the DC component. The second predetermined range is the same as, for example, the aforementioned predetermined range (that is, deviation range of the DC designated value).

An increase in the observation noise a $\sigma_{meas}$ enables the Kalman gain g(k) to be reduced as can be seen from the following Expression (8). When the Kalman gain g(k) becomes smaller, as can be seen from the following Expression (9), the Kalman filter 120 relies on the past estimation value x⁻(k). That is, when it can be determined that the signal level of the input signal PI exceeds the second predetermined range and that a change in the physical quantity signal of the gyro sensor is large, the reliability of the input signal PI which is an observation value deteriorates. On the other hand, the observation noise $\sigma_{meas}$ is a not increased within the second predetermined range, and thus the weight of the observation value is raised. In this manner, the DC component is estimated with a further emphasis on the observation value within the second predetermined range, and thus the DC component is not able to be estimated by the observation value which is far apart from the true value.

Specifically, as shown in FIG. 8, the noise estimation portion 110 includes a limiter 153 and a multiplication portion 154. When the signal level of the input signal PI is equal to or less than the second predetermined range, the limiter 153 limits the signal level of the input signal PI to a predetermined lower limit. The multiplication portion 154 multiplies the observation noise a $\sigma_{meas}$ by the signal level of the input signal PI which is limited by the limiter 153. For example, in FIG. 8, a gain processing portion 152 multiplies the absolute value of the input signal PI by a gain GA2=1/d of the following Expression (20). Since d is in the second predetermined range, the output of the gain processing portion 152 is smaller than 1 when the signal level is in the second predetermined range. The limiter 153 limits a lower limit to 1. Therefore, when the signal level is in the second predetermined range, observation noise $\sigma_{meas}$ is multiplied by 1, and the observation noise a $\sigma_{meas}$ does not increase.

In this manner, the signal level of the input signal PI is limited and the observation noise $\sigma_{meas}$ is multiplied by the resultant, thereby allowing the observation noise a $\sigma_{meas}$ not to be increased within the second predetermined range. Thereby, the reliability of the observation value is raised within the second predetermined range, and thus it is possible to intensively search for the DC component within the second predetermined range.

The signal processing device 100 shown in FIG. 4 includes the noise estimation portion 110, the Kalman filter 120, and the subtraction portion 121. The same components as those in the signal processing device 100 shown in FIG. 2 are denoted by the same reference numerals and signs, and thus the description thereof will not be given.

The noise estimation portion 110 estimates the observation noise a $\sigma_{meas}$ and the system noise $\sigma_{sys}$, and the observation noise a $\sigma_{meas}$ and the system noise $\sigma_{sys}$ which are estimated are output to the Kalman filter 120. Specifically, a temperature sensor 190 outputs a detection signal TS as an output signal TS. The noise estimation portion 110 outputs the system noise $\sigma_{sys}$ based on the output signal TS. For example, as described later in FIG. 10, the noise estimation portion 110 receives the physical quantity signal PI as an input signal, generates the observation noise a $\sigma_{meas}$ and the system noise $\sigma_{sys}$ from the input signal PI, and further adds system noise, generated from the output signal TS of the temperature sensor 190, to the system noise $\sigma_{sys}$.

Incidentally, as described later in FIG. 5, in the convergence state of the Kalman filter 120, the Kalman filter 120 operates as the low-pass filter of the cut-off frequency $f_c$ (the following Expression (16)). In this case, the DC offset of the gyro sensor changes depending on a change in temperature, and the DC component of the input signal PI changes. Since the cut-off frequency $f_c$ is very low in order to extract the DC component, there is the possibility of the filter not being able to follow a change in the DC component.

In this regard, in the present embodiment, since the system noise $\sigma_{sys}$ is output on the basis of the output signal TS of the temperature sensor 190, it is possible to adaptively control the filter characteristics of the Kalman filter 120 depending on the temperature, and to follow a change in the DC component. Specifically, in a convergence state, there is a relation of the following Expression (18) between the system noise $\sigma_{sys}$ and the cut-off frequency $f_c$. That is, the system noise $\sigma_{sys}$ is controlled depending on the temperature, and thus it is possible to change the cut-off frequency $f_c$ in accordance with a change in the DC component due to a change in temperature.

As described later in FIG. 10, the noise estimation portion 110 increases the system noise $\sigma_{sys}$ in response to a change in the output signal TS of the temperature sensor 190. Specifically, a change in the output signal TS of the temperature sensor 190 is expressed as ΔT·TSEN using temperature change ΔT (° C./sec) and sensitivity TSEN (digi/° C.) of the temperature sensor 190. As shown in the following Expression (20), a low-pass filter 163 of FIG. 10 outputs an output $LPF2_{OUT}$ based on ΔT·TSEN. The noise estimation portion 110 adds a signal generated from this output $LPF2_{OUT}$ to the system noise $\sigma_{sys}$, and increases the system noise $\sigma_{sys}$.

As shown in the following Expression (21), information regarding at what rate (frequency f) the DC component changes depending on a change in temperature is obtained by using a change in the output signal TS of the temperature sensor 190. The system noise $\sigma_{sys}$ is increased so that the frequency can be passed, and the filter characteristics of the Kalman filter 120 are controlled, thereby allowing the filter to follow a change in the DC component depending on a change in temperature.

More specifically, the noise estimation portion 110 increases the system noise $\sigma_{sys}$ by performing gain processing of multiplying a change value (output of the low-pass filter 163) of the output signal TS of the temperature sensor 190 by a predetermined gain GA3.

As can be seen from the following Expressions (18) and (22), the product of the output of the low-pass filter 163 and the gain GA3 changes the Kalman gain g in the convergence state. The Kalman gain g relates to the cut-off frequency $f_c$ from the following Expression (18). Therefore, when a change in temperature occurs, how much the cut-off frequency $f_c$ changes can be set based on the gain GA3. That is, the predetermined gain GA3 is set so as to allow a changed DC component depending on a change in temperature to pass through, and the predetermined gain GA3 is multiplied, thereby allowing the Kalman filter 120 to follow a change in temperature.

The above-mentioned predetermined gain GA3 is set on the basis of the temperature variation coefficient of the input signal PI and the sensitivity of the temperature sensor 190. In addition, kΔT shown in the following Expression (21) is the amount of change of the physical quantity signal PI of the gyro sensor with respect to the temperature change ΔT. That is, k (digi/° C.) is the temperature variation coefficient of the input signal PI. As shown in the following Expression (22), the gain GA3 is set by the temperature variation coefficient k (digi/° C.) and the sensitivity TSEN (digi/° C.) of the temperature sensor 190.

When the output signal TS of the temperature sensor 190 changes, how much the physical quantity signal PI of the gyro sensor changes can be seen from the sensitivity TSEN (digi/° C.) of the temperature sensor 190 and the temperature variation coefficient k (digi/° C.) of the gyro sensor. That is, the gain GA3 is determined from the information, and thus it is possible to cause the filter characteristics of the Kalman filter 120 to follow a temperature variation in the DC offset of the gyro sensor, and to allow passing through of the DC component changed by the temperature.

In this manner, the noise estimation portion 110 outputs the system noise $\sigma_{sys}$, and thus the Kalman filter 120 can change the cut-off frequency $f_c$ of a low-pass filter operation in a convergence state (the following Expression (18)). That is, the Kalman filter 120 is configured such that filter characteristics are adaptively controlled by the system noise $\sigma_{sys}$ which is given by the noise estimation portion 110, thereby allowing the filter to follow a change in the DC component depending on a change in temperature.

Figure 10:
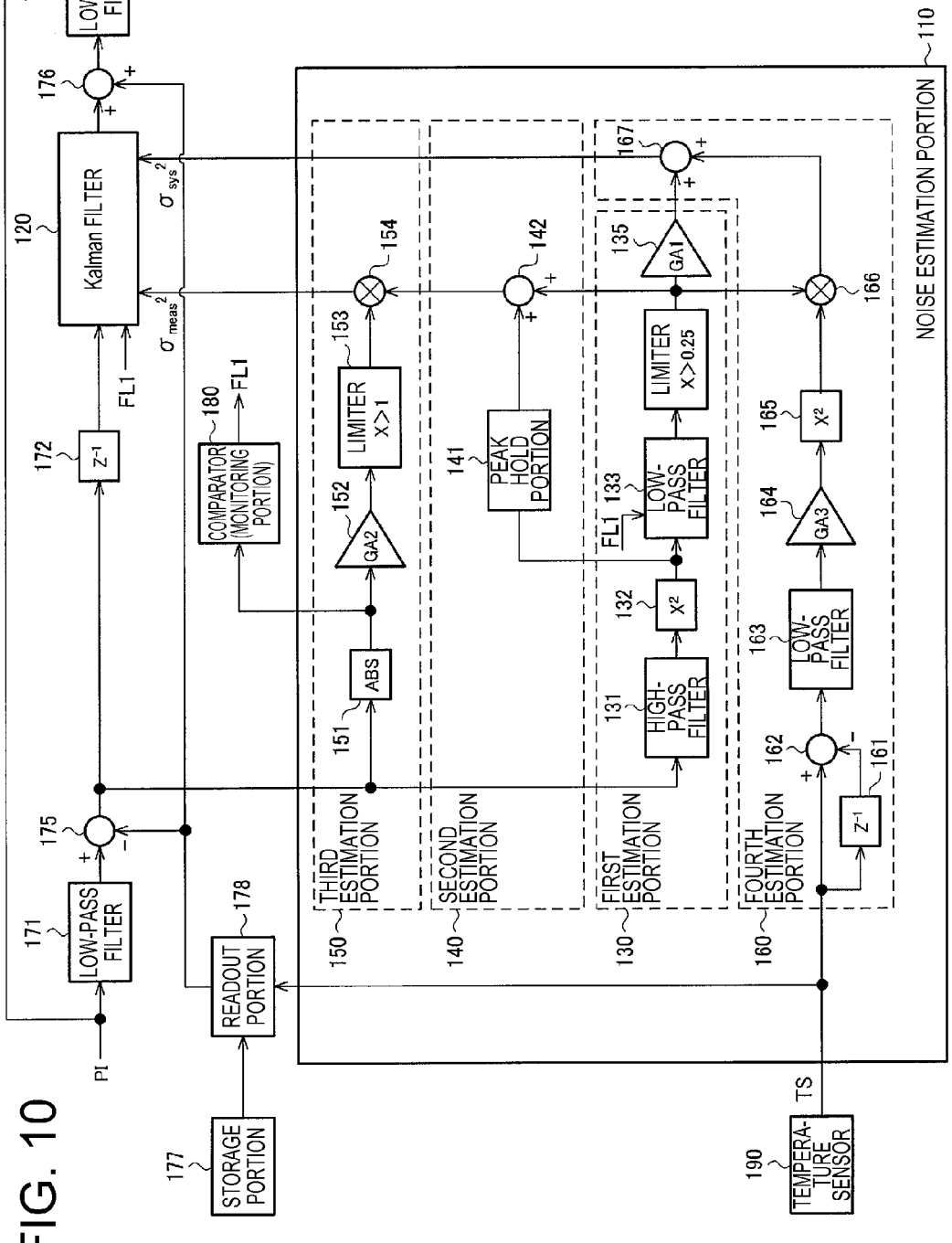
FIG. 10 is a fourth detailed configuration example illustrating the signal processing device.

As shown in FIG. 10, the signal processing device 100 includes the storage portion 177 that stores the DC designated value (solid line of FIG. 9) corresponding to the temperature characteristics of the DC component of the input signal PI, and the subtraction portion 175 that subtracts the DC designated value (solid line of FIG. 9) corresponding to the temperature characteristics of the DC component of the input signal PI from the input signal PI. The Kalman filter 120 performs Kalman filter processing the input signal PI after the subtraction. For example, the temperature characteristics of the DC offset are measured in advance with respect to the physical quantity signal PI of the gyro sensor, and the central value of variation (deviation range shown by dotted lines of FIG. 9) of the DC offset is set to a DC designated value.

As described later in FIG. 11, the DC designated value is a value obtained by expecting the true value of the DC offset, and thus includes an error due to an approximation with respect to the true value, and an error due to an individual difference. For this reason, even after the DC designated value is subtracted from the input signal PI, the temperature characteristics of the DC component remain, and the DC component of the input signal PI fluctuates due to the remaining temperature characteristics. As described above, in the present embodiment, the system noise $\sigma_{sys}$ is controlled, and thus it is possible to follow a fluctuation in the DC component as mentioned above.

2. First Detailed Configuration of Signal Processing Device

Next, detailed configurations and operations of the signal processing device will be described. FIG. 5 shows a first detailed configuration example of the signal processing device 100. The signal processing device 100 includes the noise estimation portion 110, the Kalman filter 120, a low-pass filter 171, a delay portion 172, a low-pass filter 173, and the subtraction portion 121.

The Kalman filter 120 extracts the DC component through a linear Kalman filter, using an input signal which is input from the delay portion 172 as an observation value. The basic expressions of the linear Kalman filter are the following Expressions (1) to (5).

$$x^-(k) = Ax(k-1) \tag{1}$$

$$P^-(k) = AP(k-1)A^T + \sigma_{sys}(k-1)^2 bb^T \tag{2}$$

$$g(k) = \frac{P^-(k)c(k)}{c^T(k)P^-(k)c(k) + \sigma_{meas}(k)^2} \tag{3}$$

$$x(k) = x^-(k) + g(k)(y(k) - c^T(k)x^-(k)) \tag{4}$$

$$P(k) = (1 - g(k)c^T(k))P^-(k) \tag{5}$$

The above Expressions (1) and (2) are expressions of time update (prediction process), and the above Expressions (3) to (5) are expressions of observation update (observation process). Here, k represents a discrete time, and the time update and the observation update are performed once whenever k increases by one. In addition, x(k) is the estimation value of the Kalman filter 120, and x⁻(k) is an advance estimation value predicted before the observation value is obtained. P(k) is the error covariance of the Kalman filter 120, and P⁻(k) is an error covariance predicted before the observation value is obtained. In addition, y(k) is an observation value. In addition, $\sigma_{sys}(k)$ is system noise, and a $\sigma_{meas}(k)$ is observation noise. A is a coefficient matrix, and b and c are coefficient vectors. A, b, and c are determined according to a state space model which is obtained by modeling a system.

In the present embodiment, since a primary linear model is used, the relation of A=b=c=1 is established, and the above Expressions (1) to (5) change to the following Expressions (6) to (10).

$$x^-(k) = x(k-1) \tag{6}$$

$$P^-(k) = P(k-1) + \sigma_{sys}(k)^2 \tag{7}$$

$$g(k) = \frac{P^-(k)}{P^-(k) + \sigma_{meas}(k)^2} \tag{8}$$

$$x(k) = x^-(k) + g(k)(y(k) - x^-(k)) \tag{9}$$

$$P(k) = (1 - g(k))P^-(k) \tag{10}$$

The Kalman filter 120 stores an estimation value x(k−1) and an error covariance P(k−1) which are updated to time k−1 before one. The observation value y(k), the observation noise a $\sigma_{meas}(k)$, and the system noise $\sigma_{sys}(k)$ are received at the present time k, the time update and the observation update of the above Expressions (6) to (10) are executed using them, and the estimation value x(k) is output as the DC component.

The low-pass filter 171 is a decimation filter that reduces the frequency (for example, 15 kHz) of the physical quantity signal from the gyro sensor up to the operating frequency (for example, 100 Hz) of the Kalman filter 120. The operating frequency is the input sampling frequency of the Kalman filter 120, and is different from the frequency of an internal arithmetic operation. A signal which is input to the Kalman filter 120 can be prevented from being repeated by this filter. The filter does not require steep attenuation characteristics, and thus is formed of, for example, a primary low-pass filter. The cut-off frequency is set to, for example, approximately ¼ to ⅙ of the operating frequency of the Kalman filter 120.

The delay portion 172 delays the input signal of the Kalman filter 120 by the same time as a delay time caused by the arithmetic operation of the noise estimation portion 110. For example, when the delay of one step is performed in the noise estimation portion 110, the delay portion 172 also delays the input signal by one step, and thus the timing of the observation noise a $\sigma_{meas}$ and the system noise $\sigma_{sys}$ and the timing of the input signal can be made to conform with each other.

The low-pass filter 173 filters a final output of the Kalman filter 120. Basically, the Kalman filter 120 outputs a DC value, and thus a low cut-off frequency (for example, 0.1 Hz) is set in the low-pass filter 173. In addition, the low-pass filter 173 is an interpolation filter that up-samples the operating frequency (for example, 100 Hz) of the Kalman filter 120 to the frequency (for example, 15 kHz) of the physical quantity signal of the gyro sensor.

The noise estimation portion 110 generates the observation noise a $\sigma_{meas}$ and the system noise $\sigma_{sys}$ which dynamically change, on the basis of the input signal PI which is processed by the low-pass filter 171. Specifically, the noise estimation portion 110 includes a first estimation portion 130. The first estimation portion 130 includes a high-pass filter 131, a square processing portion 132, a low-pass filter 133, a limiter 134, and a gain processing portion 135.

The high-pass filter 131 receives a signal from the low-pass filter 171, and removes a DC component from the signal. Since a mean square is performed in the post-stage thereof, the DC component is removed, and thus the DC component can be prevented from being squared and changing to the error of the observation noise a $\sigma_{meas}$.

The square processing portion 132 squares a signal from the high-pass filter 131. The low-pass filter 133 filters the signal squared by the square processing portion 132, and obtains a mean square. The noise component of the signal is extracted by this mean square. Basically, the output is a DC value, and the cut-off frequency is set to an extremely low value. For example, a cut-off frequency sufficiently lower than the frequency of the signal component of motion detected by the gyro sensor is set. In this manner, it is possible to extract only a noise component contained in the signal.

The limiter 134 performs limit processing on the signal from the low-pass filter 133, and outputs the signal after the limit processing as the dispersion (square) of the observation noise $\sigma_{meas}$. Specifically, when the signal from the low-pass filter 133 is equal to or less than a lower limit, the output is limited to the lower limit, and when the signal from the low-pass filter 133 is larger than the lower limit, the signal is output as it is. The pre-stage of the signal processing device 100 is provided with an A/D conversion portion (A/D conversion circuit 66 of FIG. 14). Since the noise component never falls below the quantization noise of the A/D conversion portion, the output of the low-pass filter 133 is provided with a lower limit of, for example, 0.25 degit.

The gain processing portion 135 multiplies the dispersion of the observation noise a $\sigma_{meas}$ from the limiter 134 by the constant gain GA1, and obtains the dispersion (square) of the system noise $\sigma_{sys}$. The gain GA1 is set as in the following Expression (19). A method of deriving the following Expression (19) will be described below.

First, the relationship between the observation noise $\sigma_{meas}$ and the system noise $\sigma_{sys}$ in a state where a sufficient time has elapsed is obtained. The state where a sufficient time has elapsed may be assumed to be a status of k=∞, and the following Expression (11) is established when an advance error covariance P⁻(k) converges on a constant value. The convergence value of the advance error covariance P⁻(k) is set to $p_0$.

$$p_0 = P^-(k) = P^-(k+1) \quad (11)$$

When the above Expression (11) is applied to the above Expressions (7) and (10), the following Expression (12) is established.

$$P^-(k+1) = (1 - g(k))P^-(k) + \sigma_{sys}^2 \rightarrow p_0 = \frac{\sigma_{sys}^2}{g(k)} \quad (12)$$

In addition, when the above Expression (11) is applied to the above Expression (8), the following Expression (13) is established.

$$g(k) = \frac{p_0}{p_0 + \sigma_{meas}^2} \quad (13)$$

When the above Expressions (12) and (13) are solved for the Kalman gain g(k) as simultaneous equations, the following Expression (14) is established. In the following Expression (14), the Kalman gain g(k) in convergence state k=∞ is set to g. In addition, in the approximation of the right side, a passband is very low in the convergence state of the Kalman filter 120, and thus it is assumed that the relation of $\sigma_{sys} \ll \sigma_{meas}$ is established.

$$g = g(k=\infty) = \frac{\sigma_{sys}}{2\sigma_{meas}^2}\left(\sqrt{\sigma_{sys}^2 + 4\sigma_{meas}^2} - \sigma_{sys}\right) \cong \frac{\sigma_{sys}}{\sigma_{meas}} \quad (14)$$

As can be seen from the above Expression (14), the Kalman gain g is a ratio between the system noise $\sigma_{sys}$ and the observation noise a $\sigma_{meas}$ in the convergence state. That is, it can be understood that the relations of $\sigma_{sys}^2 = g^2 \sigma_{meas}^2$ and gain GA1=$g^2$ are established. When the relationship between the desired filter characteristics and the Kalman gain g for extracting the DC component can be understood, the gain GA1 can be set so that the desired filter characteristics are obtained.

In order to understand the relationship between the desired filter characteristics and the Kalman gain g, the transfer characteristics of the Kalman filter 120 in the convergence state are obtained. A transfer function H (z) is expressed as the following Expression (15) on the basis of the above Expressions (6) and (9). The Kalman filter 120 is characterized by a continuous change of a configuration to a theoretically perfect filter on the basis of the current estimated error, and does not always follow the transfer function of the following Expression (15). The following Expression (15) is a final transfer function when a time elapses, to the end.

$$x(k) = x(k-1) + g(y(k) - x(k-1)) \rightarrow H(z) = \frac{x(k)}{y(k)} = \frac{g}{1-(1-g)z^{-1}} \quad (15)$$

When bilinear transformation is applied to the above Expression (15), the following Expression (16) is established.

$$H(s) = \frac{1 + \frac{1}{2f_s}s}{1 + \frac{2-g}{2gf_s}s} \quad (16)$$

When the denominator of the above Expression (16) is seen, it can be understood that the transfer function includes low-pass filter characteristics. The cut-off frequency $f_c$ of the low-pass filter characteristics is expressed as the following Expression (17). Here, $f_s$ is the sampling frequency (operating frequency) of the Kalman filter 120.

$$f_c = \frac{1}{2\pi}\frac{2g}{2-g}f_s \quad (17)$$

When the above Expression (17) is solved for the Kalman gain g, the following Expression (18) is established. In the approximation of the right side of the following Expression (18), the relation of $f_c \ll f_s$ is set.

$$g = \frac{\sigma_{sys}}{\sigma_{meas}} = \frac{2\pi f_c}{f_s}\left(\frac{\pi f_c}{f_s} + 1\right)^{-1} \cong \frac{2\pi f_c}{f_s} \quad (18)$$

From the above Expression (18), gain $GA1=g^2$ is obtained as in the following Expression (19).

$$GA1 = \left(\frac{2\pi f_c}{f_s}\right)^2 \quad (19)$$

In the above Expression (19), a desired cut-off frequency (target cut-off frequency) which is desired to be finally obtained in the convergence state is set to $f_c$. By setting such a gain GA1, the Kalman filter 120 acts as a low-pass filter as in the above Expression (16) when a sufficient time elapses, and the cut-off frequency is caused to converge on $f_c$.

3. Second Detailed Configuration of Signal Processing Device

FIG. 6 shows a second detailed configuration example of the signal processing device 100. The signal processing device 100 includes the noise estimation portion 110, the Kalman filter 120, the low-pass filter 171, the delay portion 172, the low-pass filter 173, and the subtraction portion 121. The same components as those in the first detailed configuration example are denoted by the same reference numerals and signs, and thus the description thereof will not be given.

The noise estimation portion 110 includes the aforementioned first estimation portion 130 and the second estimation portion 140 that dynamically changes the observation noise $\sigma_{meas}$ on the basis of an AC component (component of motion) which is extracted from the physical quantity signal of the gyro sensor.

Specifically, the second estimation portion 140 includes a peak hold portion 141 and an addition portion 142.

The peak hold portion 141 receives a signal of an AC component passing through the high-pass filter 131 and the square processing portion 132 of the first estimation portion 130, and performs peak hold on the signal. Since responsiveness is important in order to pass a signal of motion which is detected by the gyro sensor, the high-pass filter 131 is required not to make the cut-off frequency excessively low. For example, the cut-off frequency is set to approximately 10 Hz. The peak hold processing is, for example, processing of comparing the past signal with the present signal, and holding the larger signal. As shown in FIG. 7, when the present signal does not exceed the holding signal for a certain period (hold period), the hold is stopped and the present signal is output.

The addition portion 142 adds the signal from the peak hold portion 141 to the observation noise a $\sigma_{meas}$ from the first estimation portion 130, the signal after the addition is output to the Kalman filter 120. As the motion which is detected by the gyro sensor is larger, the signal from the peak hold portion 141 also becomes larger. Therefore, as the motion is larger, the observation noise $\sigma_{meas}$ increases. When the observation noise $\sigma_{meas}$ is increased, the Kalman gain g(k) decreases as can be seen from the above Expression (8), and thus it is possible to calculate the estimation value x(k) by reducing the weight of observation value y(k) as can be seen from the above Expression (9). Thereby, as the AC component of motion is larger, the influence of the observation value y(k) is reduced, and thus it is possible to extract a higher-accuracy DC component.

The reason for performing the peak hold will be described. As shown in FIG. 7, when the gyro sensor detects a motion and the output of the high-pass filter 131 severely vibrates, it can be understood that there is a moment when the output of the square processing portion 132 which is obtained by squaring the output falls to zero. At that moment, the signal is not added to the observation noise $\sigma_{meas}$ in spite of the AC component being present in the signal, and thus it is not possible to reduce the weight of the observation value y(k). For this reason, the observation value y(k) with the AC component influences the estimation value x(k) to some extent, the estimation accuracy of the DC component is reduced.

In this regard, the signal which is added to the observation noise $\sigma_{meas}$ can be prevented from being zero by the peak hold processing. A hold time is set to, for example, the operation cycle number of the Kalman filter 120, and an appropriate time may be determined on the basis of experimental results or the like. For example, the time is set to several tens cycles.

4. Third Detailed Configuration of Signal Processing Device

FIG. 8 shows a third detailed configuration example of the signal processing device 100. The signal processing device 100 includes the noise estimation portion 110, the Kalman filter 120, the low-pass filter 171, the delay portion 172, the low-pass filter 173, the subtraction portion 175, an addition portion 176, the storage portion 177, a readout portion 178, a comparator 180, and the subtraction portion 121. The same components as those in the first and second detailed configuration examples are denoted by the same reference numerals and signs, and thus the description thereof will not be given.

The storage portion 177 stores an offset table in which the temperature and the DC designated value (approximate DC value) as shown in FIG. 9 ae associated with each other. The DC designated value is a central value of deviation which is obtained by approximating the temperature characteristics using a quadratic function of temperature. The storage portion 177 is constituted by, for example, a non-volatile memory (for example, EPROM) or the like. The readout portion 178 refers to the offset table on the basis of the detection signal TS from the temperature sensor 190, and outputs the DC designated value corresponding to a detection temperature. The subtraction portion 175 subtracts the DC designated value from the output signal of the low-pass filter 171, and outputs the signal after the subtraction to the delay portion 172 and the noise estimation portion 110. The addition portion 176 adds the output signal of the Kalman filter 120 to the DC designated value, and outputs the signal after the addition to the low-pass filter 173.

As described above, the Kalman filter 120 and the noise estimation portion 110 performs processing on the input signal after the DC designated value is subtracted. This is equivalent to processing of previously giving an expected approximate DC value. In this manner, the convergence of the DC estimation is improved. Therefore, in a situation where it is difficult to perform a greatly varying DC estimation, it is possible to prevent an estimation from being performed using a separated DC value, and to improve reliability. Once an estimation is performed using the separated DC value, the time constant (for example, reciprocal of 0.1 mHz of the cut-off frequency) of the Kalman filter 120 is very long. Therefore, there is the possibility of a lot of time being taken to return to an original estimation value, but this can be prevented from occurring in the present embodiment.

The noise estimation portion 110 includes the first estimation portion 130 and the second estimation portion 140 which are described above, and a third estimation portion 150 that dynamically changes the observation noise a $\sigma_{meas}$ depending on the degree of separation from the DC designated value.

Specifically, the third estimation portion 150 includes an absolute value calculation portion 151, a gain processing portion 152, a limiter 153, and a multiplication portion 154.

The storage portion 177 further stores a designated value d which is used in the gain processing portion 152, and maximum deviation values (dotted lines of FIG. 9) of the DC designated value which is used in the comparator 180. The maximum deviation value is, for example, a value which does not have temperature characteristics. In the DC designated value and the maximum deviation value, for example, a plurality of samples of the gyro sensor are measured, and are set on the basis of the results. Since the maximum deviation value is used in the post-stage of the absolute value calculation portion 151, the absolute value of the maximum deviation value may be stored in reality. Any value can be set as the designated value d, but is the same as, for example, the maximum deviation value. Hereinafter, an example in which the designated value d is the maximum deviation value will be described.

The absolute value calculation portion 151 calculates the absolute value of a signal from the subtraction portion 175. The gain processing portion 152 multiplies the absolute value by a gain GA2 of the following Expression (20). When a signal after the multiplication is larger than 1, the limiter 153 outputs the signal as it is. When the signal after the multiplication is equal to or less than 1, the output is limited to 1. The multiplication portion 154 multiplies the observation noise a $\sigma_{meas}$ from the second estimation portion 140 by the signal from the limiter 153.

$$GA2 = \frac{1}{d} \quad (20)$$

That is, when the physical quantity signal of the gyro sensor falls outside the deviation range, the absolute value becomes larger than d, and thus the multiplication of the gain GA2 becomes larger than 1. In this case, the limiter 153 outputs a value greater than 1, and the observation noise $\sigma_{meas}$ increases. On the other hand, when the physical quantity signal falls within the deviation range, the absolute value becomes smaller d, the multiplication of the gain GA2 becomes equal to or less than 1. In this case, the limiter 153 outputs 1, and the observation noise a $\sigma_{meas}$ does not increase.

When the observation noise $\sigma_{meas}$ increases, the estimation value x⁻(k) is relied on from the above Expressions (8) and (9), and thus the weight of the observation value y(k) is reduced beyond the deviation range. Conversely, the weight of the observation value y(k) is raised within the deviation range, and the DC component of the observation value y(k) is intensively search for within the deviation range. In this manner, the deviation range which is considered that the true value of DC is present is intensively searched for, and the reliability of the observation value y(k) which is considered not to be a true value beyond the deviation range is reduced, thereby allowing the accuracy of the DC estimation to be improved.

As described above, in the present embodiment, the DC estimation is intensively performed within the deviation range. Therefore, when the true value of DC falls outside the range, a DC estimation velocity is extremely delayed and is considerably vulnerable to a disturbance (large input to the signal), and the DC estimation value fluctuates immediately. For this reason, the maximum deviation value is required not to be made excessively small so that the true value falls within the deviation, and be designated in consideration of a secular change.

Next, the comparator 180 (monitoring portion) will be described. The comparator 180 monitors a motion component of the physical quantity signal of the gyro sensor, and outputs a flag FL1 (stop signal) indicating the absence or presence of the motion. Specifically, using the maximum deviation value as a threshold, the signal from the absolute value calculation portion 151 and the threshold are compared with each other, and the flag FL1 is set to be active when the signal is larger than the threshold. That is, when a motion larger than the deviation range occurs, the flag FL1 becomes active. The flag FL1 is input to the Kalman filter 120, and the low-pass filter 133 of the first estimation portion 130.

When a motion is applied to the gyro sensor and the input signal changes greatly, the accuracy of the DC estimation decreases, and the error covariance P(k) corresponding to an estimation error becomes larger. Then, the Kalman gain g(k) comes close to 1 as can be seen from the above Expression (8), and the observation value y(k) influenced by the motion is relied on as can be seen from the above Expression (9).

Consequently, when the flag FL1 is active, the Kalman filter 120 performs only the estimation of the estimation value x(k), and performs processing in which the error covariance P(k) is not updated. Specifically, the processes of the above Expressions (6) to (9) are executed, and the process of the above Expression (10) is not executed. Thereby, it is possible to raise the reliability of the past estimation value x⁻(k) having a small influence of the motion, and to improve the estimation accuracy of the DC component.

When the flag FL1 is active, the low-pass filter 133 stops the low-pass filter operation, and continues to output the output value when the flag FL1 changes from inactive to active. Thereby, the low-pass filter processing is performed on only the signal within the deviation range, and thus it is possible to prevent the inaccurate observation noise $\sigma_{meas}$ from being extracted by the signal influenced by the motion.

5. Fourth Detailed Configuration of Signal Processing Device

FIG. 10 show a fourth detailed configuration example of the signal processing device 100. The signal processing device 100 includes the noise estimation portion 110, the Kalman filter 120, the low-pass filter 171, the delay portion 172, the low-pass filter 173, the subtraction portion 175, the addition portion 176, the storage portion 177, the readout portion 178, the comparator 180, and the subtraction portion 121. The same components as those in the first to third detailed configuration examples are denoted by the same reference numerals and signs, and thus the description thereof will not be given.

The noise estimation portion 110 includes the first estimation portion 130 and the second estimation portion 140, the third estimation portion 150 which are described above, and a fourth estimation portion 160 that returns the Kalman filter 120 from a convergence state to the estimation state at the time of a change in temperature.

Figure 11:
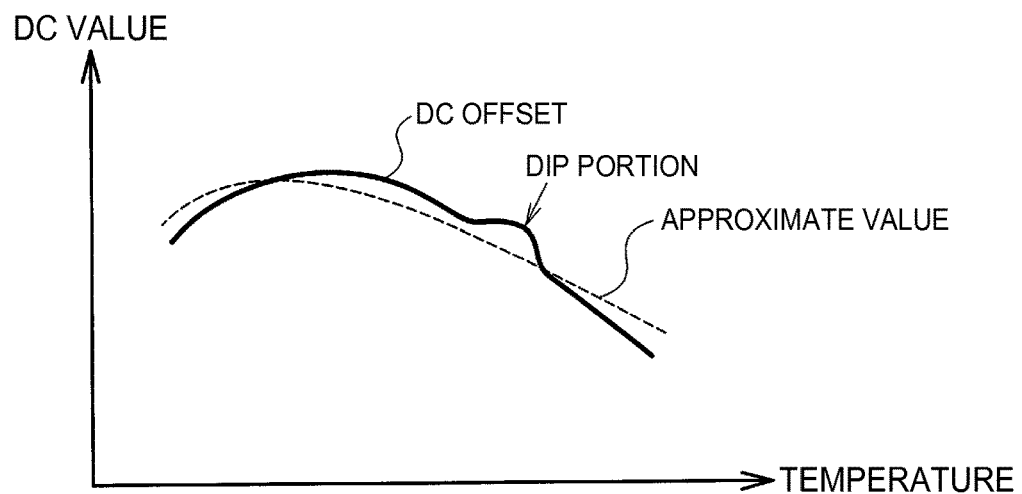
FIG. 11 is a diagram illustrating the temperature characteristics of a DC offset of a gyro sensor.
Figure 12:
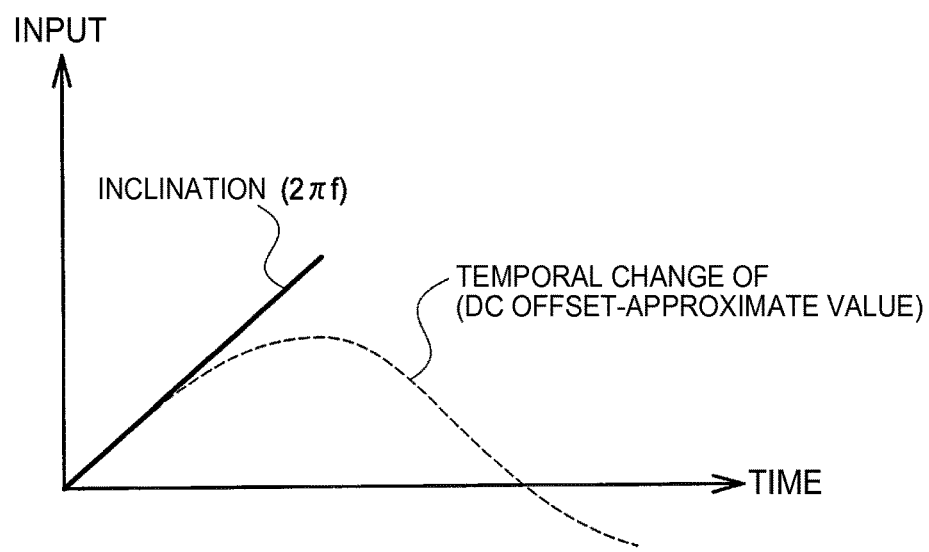
FIG. 12 is a diagram illustrating a temporal change in the DC offset due to a change in temperature.

As shown in FIG. 11, the DC offset of the gyro sensor has temperature characteristics, stores the approximate value thereof as an offset table, and is subtracted in the subtraction portion 175 and is input to the Kalman filter 120. Since the approximation is not strictly consistent with the temperature characteristics, and a dip portion is present in the temperature characteristics depending on individuals, the temperature characteristics also remain in the subtraction result. As shown in FIG. 12, when a temperature changes with the elapse of time, the input of the Kalman filter 120 also changes due to the remaining temperature characteristics.

When the DC estimation of the Kalman filter 120 converges, substantially the same characteristics as those of the low-pass filter of the target cut-off frequency $f_c$ are shown as described in the first detailed configuration example. In this condition, when the DC value of the input signal changes depending on a change in temperature, the DC value before a change in temperature is continues to be output for a while due to a low cut-off frequency $f_c$. The time is the reciprocal degree of the designated target cut-off frequency $f_c$. That is, the time refers to a time when the Kalman filter 120 is not able to follow a change in the DC value depending on a change in temperature.

Consequently, in the present embodiment, the Kalman filter 120 is returned to the estimation state by dynamically changing system noise $\sigma_{sys}$ in response to a change in temperature, and followability for a change in the DC value is improved. Specifically, the fourth estimation portion 160 includes a delay portion 161, a subtraction portion 162, a low-pass filter 163, a gain processing portion 164, a square processing portion 165, a multiplication portion 166, and an addition portion 167.

The delay portion 161 and the subtraction portion 162 obtain a difference between the detection signal TS in time k of the temperature sensor 190 and the detection signal TS in time k−1 before one. The low-pass filter 163 smooths the difference. When noise of the detection signal TS of the temperature sensor 190 is large, or when the sampling frequency of the detection signal TS is lower than the operating frequency of the Kalman filter 120 and the detection signal TS discretely changes, the system noise $\sigma_{sys}$ which is output by the fourth estimation portion 160 changes greatly. This change has a large influence on the convergence degree of the Kalman filter 120. For this reason, an extremely low cut-off frequency (for example, 10 mHz) is set in the low-pass filter 163. Thereby, a component changing to noise is reliably removed, and thus the system noise $\sigma_{sys}$ can be changed gently.

When the sensitivity TSEN (digi/° C.) and the temperature change $\Delta T$ (° C./sec) of the temperature sensor 190 are used, the output $LPF2_{OUT}$ of the low-pass filter 163 is expressed as in the following Expression (21).

$$LPF2_{OUT} = \frac{\Delta T}{f_s} TSEN \tag{21}$$

The gain processing portion 164 multiplies the signal from the low-pass filter 163 by a gain GA3. The square processing portion 165 squares the signal after the multiplication. The multiplication portion 166 multiplies the signal after the squared and the observation noise a $\sigma_{meas}$ from the first estimation portion 130 together. The addition portion 167 adds the signal after the multiplication and the system noise $\sigma_{sys}$ from the first estimation portion 130, and outputs the signal after the addition to the Kalman filter 120.

A method of setting the gain GA3 will be described. First, a change in the input signal of the Kalman filter 120 when a temperature changes is approximated by a sine wave. As shown in FIG. 12, when an inclination is considered using a primary approximation, the following Expression (22) is established. Here, k (digi/° C.) is the temperature variation coefficient of the physical quantity signal of the gyro sensor. $\Delta T$ (° C./sec) is a change in temperature per second, and thus $k\Delta T$ is the inclination of a change in the input signal. The inclination is approximated by inclination $2\pi f$ of the sine wave having a frequency f. When the above Expression (21) is substituted into $\Delta T$, and a solution for f is obtained, the right side of the following Expression (22) is established.

$$\frac{d}{dt}\sin(2\pi ft)\bigg|_{t=0} = 2\pi f \cong k\Delta T = kf_s\frac{LPF2_{OUT}}{TSEN} \rightarrow f = \frac{kf_s}{2\pi}\frac{LPF2_{OUT}}{TSEN} \tag{22}$$

Since the frequency of a change in the DC value is known to be f, the gain GA3 is determined so that the frequency passes through Kalman filter 120. That is, when the frequency f of the above Expression (22) is set to the cut-off frequency $f_c$, and is substituted into the above Expression (18) in the convergence state, the following Expression (23) is established.

$$\frac{\sigma_{sys}}{\sigma_{meas}} = k\frac{LPF2_{OUT}}{TSEN} \rightarrow GA3 = \frac{k}{TSEN} \tag{23}$$

When the sensitivity of the gyro sensor is SEN (digi/dps), and the temperature coefficient is TCOEFF (dps/° C.), the above Expression (23) changes to the following Expression (24).

$$GA3 = \frac{SEN \times TCOEFF}{TSEN} \tag{24}$$

The gain GA3 as mentioned above is set, and thus the cut-off frequency $f_c$ of the low-pass filter in the convergence state is changed to the frequency f, thereby allowing the Kalman filter 120 to be returned to the estimation state. In this case, since a cutoff is the frequency f, a change in the DC component of the input signal is passed narrowly.

In this manner, information regarding how much the DC value changes can be given to the Kalman filter 120 as the system noise $\sigma_{sys}$, depending on a change in temperature, and thus the Kalman filter 120 can be caused to follow a change in the DC component depending on a change in temperature.

6. Electronic Apparatus and Gyro Sensor

Figure 13:
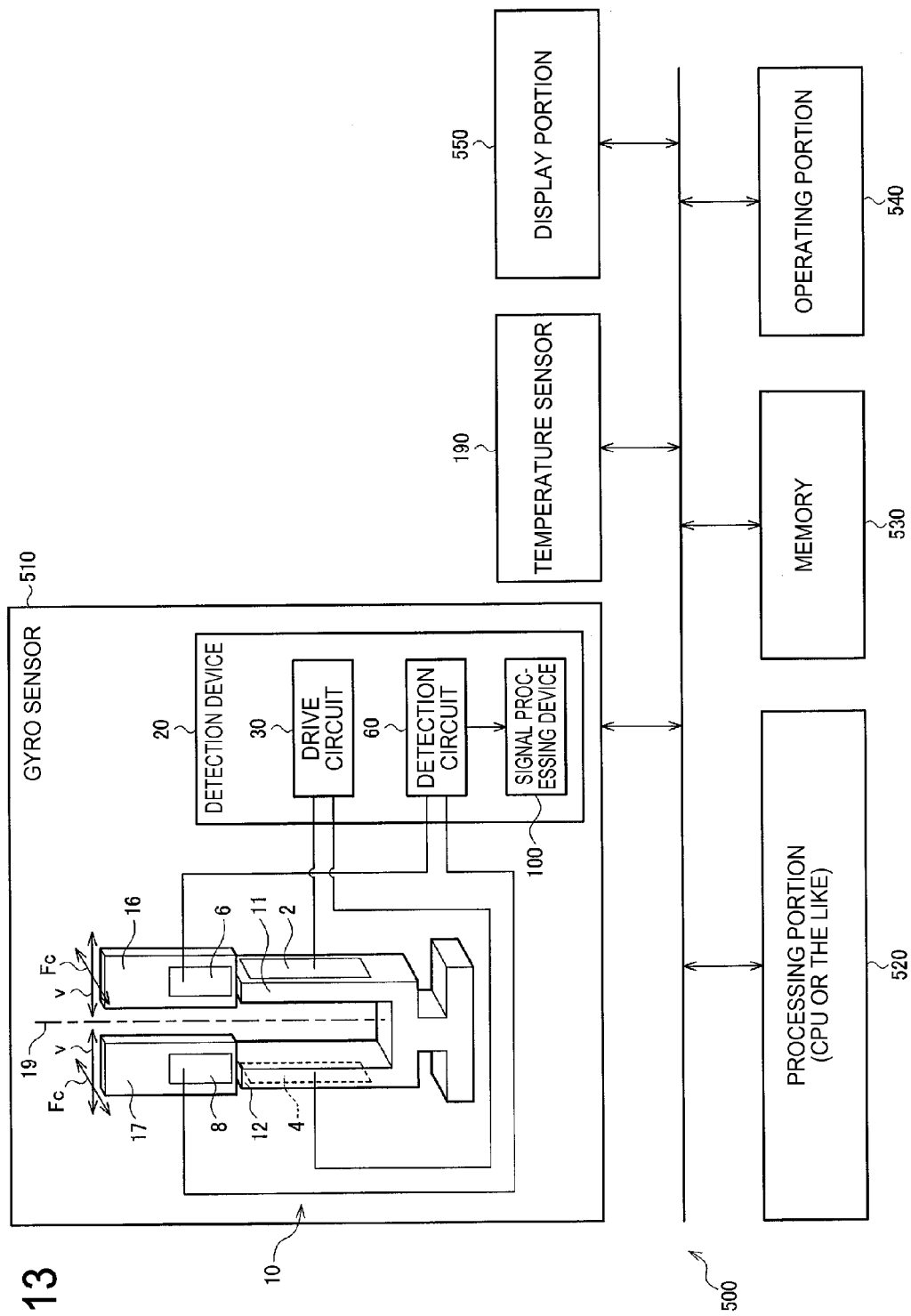
FIG. 13 is a configuration example illustrating the gyro sensor and an electronic apparatus.

FIG. 13 shows a configuration example of a gyro sensor 510 (sensor in a broad sense) including the signal processing device 100 of the present embodiment and an electronic apparatus 500 including the gyro sensor 510. The electronic apparatus 500 and the gyro sensor 510 are limited to the configuration of FIG. 13, and various modifications such as omissions of some of the components or additions of other components can be made. In addition, the electronic apparatus 500 of the present embodiment can be assumed to include various devices such as a digital camera, a video camera, a smartphone, a cellular phone, a car navigation system, a robot, a game console, a timepiece, health appliances, or a portable information terminal.

The electronic apparatus 500 includes the gyro sensor 510 and the processing portion 520. In addition, the apparatus can include the temperature sensor 190, a memory 530, an operating portion 540, and a display portion 550. The processing portion 520 (CPU, MPU or the like) performs control of the gyro sensor 510 or the like or control of the entire electronic apparatus 500. In addition, the processing portion 520 performs processing on the basis of angular velocity information (physical quantity in a broad sense) detected by the gyro sensor 510. For example, processing for shake correction, posture control, GPS autonomous navigation, or the like is performed on the basis of the angular velocity information. The memory 530 (ROM, RAM or the like) stores control programs and various types of data, or functions as a work area and a data storage area. The operating portion 540 is used for a user's operation of the electronic apparatus 500, and the display portion 550 displays various information to a user.

The gyro sensor 510 includes a vibrator 10 and a detection device 20. The vibrator 10 (physical quantity transducer in a broad sense) of FIG. 13 is a tuning fork piezoelectric vibrator which is formed of a thin plate of a piezoelectric material such as quartz crystal, and includes drive vibrators 11 and 12 and detecting vibrators 16 and 17. The drive vibrators 11 and 12 are provided with drive terminals 2 and 4, and the detecting vibrators 16 and 17 are provided with detection terminals 6 and 8.

The detection device 20 includes a drive circuit 30, a detection circuit 60, and a signal processing device 100. The drive circuit 30 outputs a drive signal (drive voltage) to drive the vibrator 10. The circuit receives a feedback signal from the vibrator 10, to thereby excite the vibrator 10. The detection circuit 60 receives a detection signal (detection current, charge) from the vibrator 10 which is driven by a drive signal, and detects (extracts) a desired signal (physical quantity signal, Coriolis force signal) based on a physical quantity applied to the vibrator 10, from the detection signal.

Specifically, an alternating drive signal (drive voltage) from the drive circuit 30 is applied to the drive terminal 2 of the drive vibrator 11. Then, the drive vibrator 11 starts to vibrate due to a reverse voltage effect, and the drive vibrator 12 also starts to vibrate due to a tuning fork vibration. In this case, a current (charge) which is generated by the piezoelectric effect of the drive vibrator 12 is fed back from the drive terminal 4 to the drive circuit 30, as a feedback signal. Thereby, an oscillation loop including the vibrator 10 is formed.

When the drive vibrators 11 and 12 vibrate, the detecting vibrators 16 and 17 vibrate at vibration velocity v in a direction shown in FIG. 13. Then, a current (charge) which is generated by the piezoelectric effect of the detecting vibrators 16 and 17 is output from the detection terminals 6 and 8 as detection signals (first and second detection signals). Then, the detection circuit 60 receives a detection signal from the vibrator 10, and detect a desired signal (desired wave) which is a signal corresponding to a Coriolis force. That is, when the vibrator 10 (gyro sensor) rotates around a detection axis 19, a Coriolis force Fc is generated in a direction perpendicular to the vibration direction of the vibration velocity v. For example, when an angular velocity during the rotation thereof around the detection axis 19 is set to ω, the mass of the vibrator is set to m, and the vibration velocity of the vibrator is set to v, the Coriolis force is expressed as Fc=2m·v·ω. Therefore, the detection circuit 60 detects a desired signal which is a signal according to the Coriolis force, and thus the rotational angular velocity ω of the gyro sensor can be obtained. By using the obtained angular velocity ω, the processing portion 520 can perform a variety of processing such as shaking correction, posture control, or GPS autonomous navigation.

FIG. 13 shows an example when the vibrator 10 is a tuning fork, but the vibrator 10 of the present embodiment is not limited to such a structure. For example, the vibrator may be a T shape, a double T, or the like. In addition, the piezoelectric material of the vibrator 10 may be a material except for quartz crystal.

7. Detection Device

Figure 14:
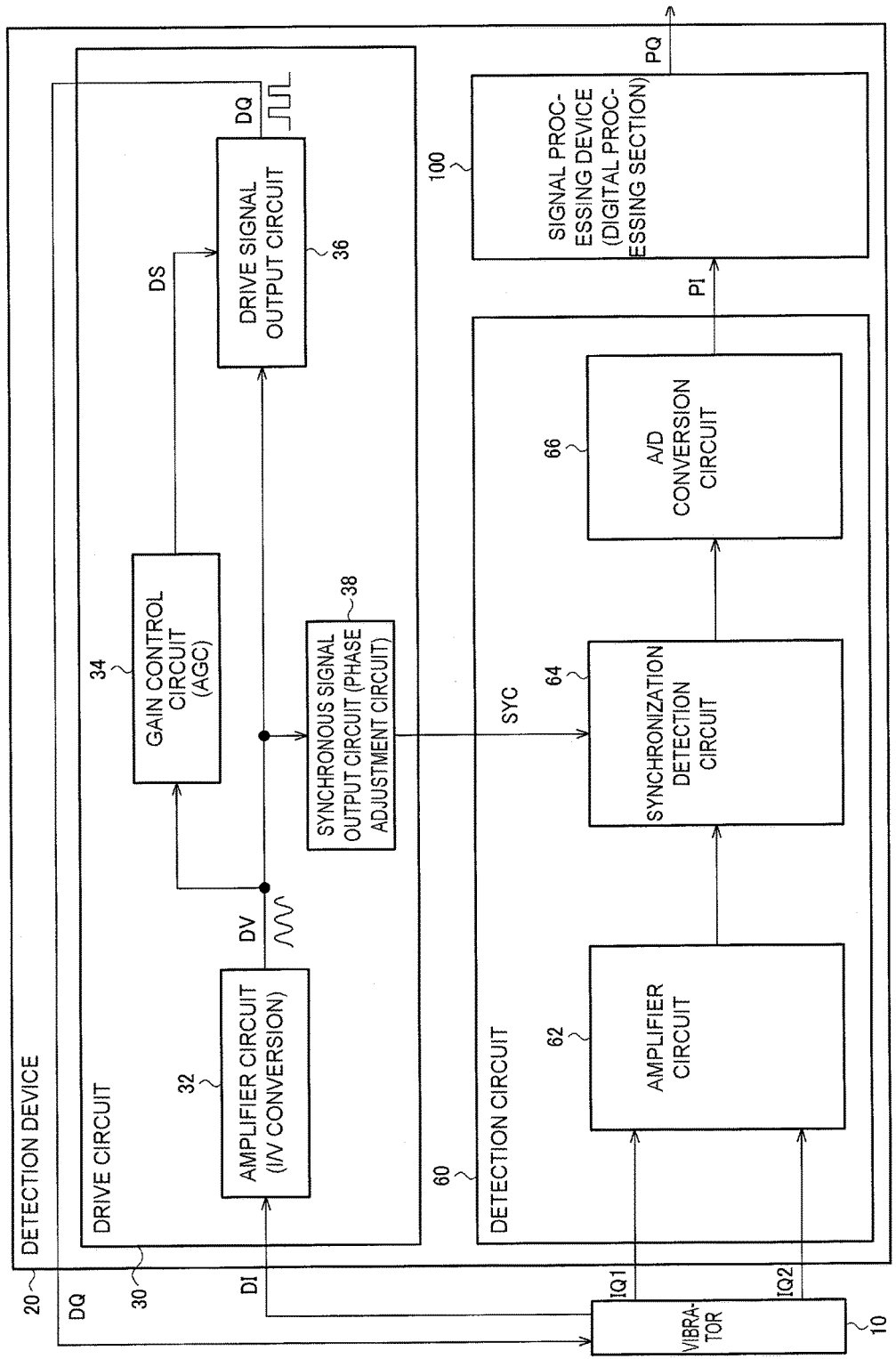
FIG. 14 is a configuration example illustrating a detection device.

FIG. 14 shows a configuration example of the detection device 20 of the present embodiment. The detection device 20 includes the drive circuit 30, the detection circuit 60, and the signal processing device 100 (digital processing portion).

The drive circuit 30 includes an amplifier circuit 32 to which a feedback signal DI from the vibrator 10 is input, again control circuit 34 that performs automatic gain control, and a drive signal output circuit 36 that outputs a drive signal DQ to the vibrator 10. In addition, the circuit includes a synchronous signal output circuit 38 that outputs a synchronous signal SYC to the detection circuit 60. The configuration of the drive circuit 30 is not limited to FIG. 12, and various modifications such as omissions of some of these components or additions of other components can be made.

The amplifier circuit 32 (I/V conversion circuit) amplifies the feedback signal DI from the vibrator 10. For example, the signal DI of a current from the vibrator 10 is converted into a signal DV of a voltage and outputs the converted signal. The amplifier circuit 32 can be realized by a capacitor, a resistive element, an operational amplifier, or the like.

The drive signal output circuit 36 outputs the drive signal DQ on the basis of the signal DV after the amplification of the amplifier circuit 32. For example, the drive signal output circuit 36 outputs a drive signal of a square wave (or sinusoidal wave). The drive signal output circuit 36 can be realized by a comparator or the like.

The gain control circuit 34 (AGC) outputs a control voltage DS to the drive signal output circuit 36, and controls the amplitude of the drive signal DQ. Specifically, the gain control circuit 34 monitors the signal DV, and controls a gain of an oscillation loop. For example, in the drive circuit 30, in order to keep the sensitivity of the gyro sensor constant, the amplitude of a drive voltage which is supplied to the vibrator 10 (drive vibrator) is required to be kept constant. For this reason, the gain control circuit 34 for automatically adjusting a gain is provided within the oscillation loop of a drive vibration system. The gain control circuit 34 adjusts a gain variably and automatically so that the amplitude (vibration velocity v of the vibrator) of the feedback signal DI from the vibrator 10 becomes constant.

The synchronous signal output circuit 38 receives the signal DV after the amplification of the amplifier circuit 32, and outputs a synchronous signal SYC (reference signal) to the detection circuit 60. The synchronous signal output circuit 38 can be realized by a comparator that generates the synchronous signal SYC of a square wave by performing binary coded processing on the signal DV of a sinusoidal wave (alternating current), a phase adjustment circuit (phase shifter) that performs phase adjustment on the synchronous signal SYC, or the like.

The detection circuit 60 includes an amplifier circuit 62, a synchronization detection circuit 64, and an A/D conversion circuit 66. The amplifier circuit 62 receives first and second detection signals IQ1 and IQ2 from the vibrator 10, and performs signal amplification or charge-voltage conversion. The synchronization detection circuit 64 performs synchronous detection on the basis of the synchronous signal SYC from the drive circuit 30. The A/D conversion circuit 66 performs A/D conversion on the signal after the synchronous detection.

As described above, the signal processing device 100 extracts the DC offset (DC component) from a desired signal, and removes an offset from the desired signal. In addition, the signal processing device 100 may perform a variety of digital signal processing. For example, the signal processing device 100 performs digital filter processing for limiting a bandwidth in accordance with an application of the desired signal, or digital filter processing for removing noise generated by the A/D conversion circuit 66 and the like. In addition, digital correction processing for gain correction (sensitivity adjustment), offset correction, or the like may be performed. The signal processing device 100 may be realized by, for example, a digital signal processor (DSP).

8. Moving Object

Figure 15:
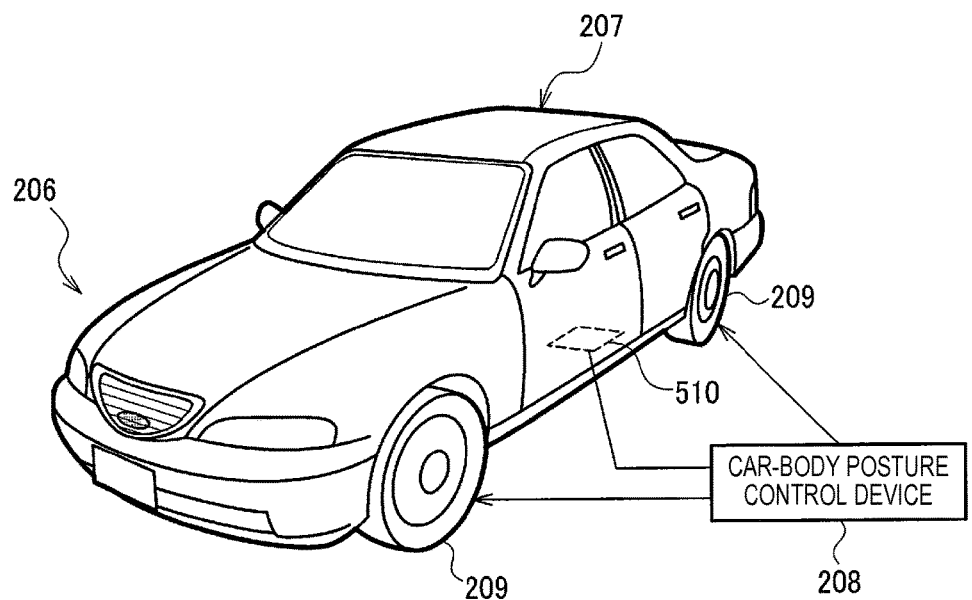
FIG. 15 is a configuration example illustrating a moving object.

FIG. 15 shows an example of a moving object including the detection device 20 of the present embodiment. The detection device 20 of the present embodiment may be incorporated into, for example, various moving objects such as a vehicle, an airplane, a bike, a bicycle, or a vessel. The moving objects are pieces of equipment or instruments which are provided with, for example, driving mechanisms such as engines or motors, steering mechanisms such as handles or rudders, and various electronic apparatuses, and move on the ground, in the air, and in the sea.

FIG. 15 schematically shows an automobile 206 as a specific example of the moving body. The gyro sensor 510 (sensor) including the vibrator 10 and the detection device of the present embodiment is incorporated into the automobile 206. The gyro sensor 510 can detect a posture of a car body 207. A detected signal of the gyro sensor 510 may be supplied to a car body posture control device 208. The car body posture control device 208 may control stiffness and softness of a suspension or a brake of each car wheel 209, for example, in accordance with a posture of the car body 207. In addition, such posture control may be used in various moving objects such as a bipedal walking robot, an airplane, and a helicopter. In order to perform posture control, the gyro sensor 510 may be incorporated thereinto.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader senses or the same meanings may be replaced with the different terminologies in any location of the specification or the drawings. All combinations of the present embodiment and modification examples are included in the scope of the invention. In addition, configurations of the signal processing device, the detection device, the sensor, the electronic apparatus, or the moving object are also not limited to the above description, and may have various modifications.

The entire disclosures of Japanese Patent Application Nos. 2013-256722 filed Dec. 12, 2013, 2013-256724 filed Dec. 12, 2013, and 2013-256725 filed Dec. 12, 2013 are expressly incorporated by reference herein.

What is claimed is:

1. A signal processing device for processing an input signal generated by a sensor and detected by a circuit, the device comprising:

a noise estimation circuit configured to (i) receive the input signal generated by the sensor, (ii) estimate an observation noise signal by extracting the observation noise signal from the received input signal, (iii) estimate a system noise signal by performing gain processing on the observation noise signal using a gain processing circuit, (iv) generate a dispersion of observation noise based on the observation noise signal, and (v) generate a dispersion of system noise based on the system noise signal; and an arithmetic circuit configured to
receive the input signal generated by the sensor,
receive, from the noise estimation circuit, the dispersion of observation noise and the dispersion of system noise,
provide the input signal, the dispersion of observation noise, and the dispersion of system noise as inputs to a Kalman filter,
perform Kalman filter processing on the input signal to extract a DC component of the input signal as an estimation value of the Kalman filter processing using the dispersion of observation noise and the dispersion of system noise as estimated from the input signal by the noise estimation circuit, and
generate an output signal to be applied to the input signal, wherein the input signal corresponds to a physical measurement performed by the sensor and the output signal adjusts the input signal based on a difference between the input signal and the extracted DC component of the input signal,
wherein the Kalman filter processing includes performing a time update process of an error covariance using the dispersion of system noise received from the noise estimation circuit and performing an observation update process of a Kalman gain using the dispersion of observation noise received from the noise estimation circuit.

2. The signal processing device according to claim 1, wherein the noise estimation circuit mean-squares the input signal, and estimates the observation noise signal by performing limiter processing on the mean-squared signal.

3. The signal processing device according to claim 1, wherein the noise estimation circuit performs high-pass filter processing on the input signal, and increases the observation noise based on the high-pass filter processed signal.

4. The signal processing device according to claim 1, wherein the noise estimation circuit performs high-pass filter processing on the input signal, mean-squares the high-pass filter processed signal and estimates the observation noise signal by performing limiter processing on the mean-squared signal.

5. The signal processing device according to claim 3, wherein the noise estimation circuit performs peak hold processing on the high-pass filter processed signal, and increases the observation noise based on the peak hold processed signal.

6. The signal processing device according to claim 4, wherein the noise estimation circuit performs peak hold processing on the mean-squared signal, and estimates the observation noise based on the limiter processed signal and peak hold processed signal.

7. The signal processing device according to claim 1, further comprising a monitor that monitors the input signal,
wherein the monitor determines whether a signal level of the input signal exceeds a predetermined range, and
the Kalman filter stops observation updating an error covariance when it is determined by the monitoring portion that the signal level of the input signal exceeds the predetermined range.

8. The signal processing device according to claim 7, wherein the noise estimation circuit stops updating the estimation of the observation noise when it is determined by the monitor that the signal level of the input signal exceeds the predetermined range.

9. The signal processing device according to claim 8, wherein the monitor compares an absolute value of the input signal with a threshold corresponding to the predetermined range, and outputs a stop signal when the absolute value is larger than the threshold,
the Kalman filter stops observation updating the error covariance when the stop signal is received, and
the noise estimation circuit stops updating the estimation of the observation noise when the stop signal is received.

10. The signal processing device according to claim 7, wherein the noise estimation circuit increases the observation noise when the signal level of the input signal exceeds a second predetermined range.

11. The signal processing device according to claim 10, wherein the noise estimation circuit includes:
a limiter that limits the signal level of the input signal to a predetermined lower limit when the signal level of the input signal falls within the second predetermined range; and
a multiplier that multiplies the observation noise by the signal level of the input signal which is limited by the limiter.

12. The signal processing device according to claim 1, wherein the noise estimation circuit outputs the system noise based on an output signal of a temperature sensor to the Kalman filter.

13. The signal processing device according to claim 12, wherein the noise estimation circuit increases the system noise in response to a change in the output signal of the temperature sensor.

14. The signal processing device according to claim 1, further comprising a subtractor that subtracts a DC designated value corresponding to temperature characteristics of a DC component of the input signal from the input signal,
wherein the Kalman filter performs Kalman filter processing on the input signal after the subtraction.

15. A detection device comprising:
a detection circuit that receives a detection signal from a physical quantity transducer, detects a physical quantity signal based on a physical quantity, and generates an input signal based on the physical quantity; and
a noise estimation circuit configured to (i) receive the input signal generated by the detection circuit, (ii) estimate an observation noise signal by extracting the observation noise signal from the received input signal, and (iii) estimate a system noise signal by performing gain processing on the observation noise signal using a gain processing circuit, (iv) generate a dispersion of observation noise based on the observation noise signal, and (v) generate a dispersion of system noise based on the system noise signal; and
an arithmetic circuit configured to
receive the input signal generated by the detection circuit,
receive, from the noise estimation circuit, the dispersion of observation noise and the dispersion of system noise,
provide the input signal, the dispersion of observation noise, and the dispersion of system noise as inputs to a Kalman filter,
perform Kalman filter processing on the input signal to extract a DC component of the input signal as an estimation value of the Kalman filter processing using the dispersion of observation noise and the dispersion of system noise as estimated from the input signal by the noise estimation circuit, and
generate an output signal to be applied to the input signal, wherein the input signal corresponds to a physical measurement performed by the physical quantity transducer and the output signal adjusts the input signal based on a difference between the input signal and the extracted DC component of the input signal,
wherein the Kalman filter processing includes performing a time update process of an error covariance using the dispersion of system noise received from the noise estimation circuit and performing an observation update process of a Kalman gain using the dispersion of observation noise received from the noise estimation circuit.

16. A sensor comprising:
a detection device according to claim 15; and
the physical quantity transducer.

17. An electronic apparatus comprising the signal processing device according to claim 1.

18. A moving object comprising the signal processing device according to claim 1.

19. The signal processing device according to claim 3, wherein the noise estimation circuit adds the high-pass filter processed signal to the observation noise signal.

20. The signal processing device according to claim 12, wherein the noise estimation circuit adds a signal based on the output signal of the temperature sensor to the system noise signal.

* * * * *